United States Patent
Yu et al.

(10) Patent No.: US 11,854,623 B2
(45) Date of Patent: Dec. 26, 2023

(54) MEMORY CONTROLLER, MEMORY DEVICE AND MEMORY SYSTEM HAVING IMPROVED THRESHOLD VOLTAGE DISTRIBUTION CHARACTERISTICS AND RELATED OPERATING METHODS

(71) Applicant: Samsung Electronics Co., Ltd., Suwon-si (KR)

(72) Inventors: Jaeduk Yu, Suwon-si (KR); Dongkyo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 17/520,276

(22) Filed: Nov. 5, 2021

(65) Prior Publication Data

US 2022/0059172 A1 Feb. 24, 2022

Related U.S. Application Data

(63) Continuation of application No. 16/661,351, filed on Oct. 23, 2019, now Pat. No. 11,183,250.

(30) Foreign Application Priority Data

Apr. 16, 2019 (KR) .......................... 10-2019-0044478

(51) Int. Cl.
*G11C 16/16* (2006.01)
*G06F 12/02* (2006.01)
(Continued)

(52) U.S. Cl.
CPC .............. *G11C 16/16* (2013.01); *G06F 3/064* (2013.01); *G06F 12/0246* (2013.01);
(Continued)

(58) Field of Classification Search
CPC . G11C 16/16; G11C 16/3431; G11C 16/3436; G06F 3/064; G06F 12/0246; G06F 3/0679; G06F 2212/7211
See application file for complete search history.

(56) References Cited

U.S. PATENT DOCUMENTS 6,392,931 B1 5/2002 Pasotti et al.
7,551,492 B2 6/2009 Kim
(Continued)

FOREIGN PATENT DOCUMENTS

KR 1020110018753 A 2/2011
KR 1020160087430 A 7/2016
WO 1997-044792 A1 11/1997

*Primary Examiner* — Vanthu T Nguyen
(74) *Attorney, Agent, or Firm* — Muir Patent Law, PLLC

(57) ABSTRACT

Provided are a memory controller and memory system having an improved threshold voltage distribution characteristic and an operating method of the memory system. As a write request of data with respect to a first block is received, an erase program interval (EPI) is determined denoting a time period elapsed after erasure of the first block. When the determined EPI is equal to or less than a reference time, data is programmed to the first block based on a first operation condition selected from among a plurality of operation conditions. When the determined EPI is greater than the reference time, the data is programmed to the first block based on a second operation condition selected from among the plurality of operation conditions.

14 Claims, 20 Drawing Sheets

(51) Int. Cl.
     *G06F 3/06*         (2006.01)
     *G11C 16/34*       (2006.01)

(52) U.S. Cl.
     CPC ...... *G11C 16/3431* (2013.01); *G11C 16/3436* (2013.01); *G06F 3/0679* (2013.01); *G06F 2212/7211* (2013.01)

(56) References Cited

U.S. PATENT DOCUMENTS

| | | |
|---|---|---|
| 7,802,064 B2 | 9/2010 | Kim |
| 8,380,915 B2 | 2/2013 | Wood et al. |
| 8,681,554 B2 * | 3/2014 | Suzuki .................. G06F 3/0619 |
| | | 365/185.16 |
| 8,964,481 B2 * | 2/2015 | Oh .................... H01L 27/11582 |
| | | 365/185.11 |
| 9,047,955 B2 | 6/2015 | Cometti et al. |
| 9,110,788 B2 | 8/2015 | D'Abreu et al. |
| 9,262,266 B2 | 2/2016 | Choi et al. |
| 9,355,738 B2 * | 5/2016 | Im .......................... G11C 16/28 |
| 9,378,137 B2 | 6/2016 | Kim et al. |
| 9,484,097 B2 | 11/2016 | Kim |
| 9,558,945 B2 | 1/2017 | Fukuzumi et al. |
| 9,690,654 B2 | 6/2017 | No et al. |
| 9,727,250 B2 * | 8/2017 | Choi ........................ G11C 8/08 |
| 9,761,308 B1 | 9/2017 | Cometti |
| 9,830,963 B1 | 11/2017 | Pang et al. |
| 9,875,044 B2 * | 1/2018 | Lee .................... G06F 16/9535 |
| 9,875,793 B2 | 1/2018 | Kim et al. |
| 9,899,092 B2 | 2/2018 | Micheloni |
| 2011/0044113 A1 | 2/2011 | Kim et al. |
| 2016/0071601 A1 | 3/2016 | Shirakawa et al. |
| 2018/0300233 A1 | 10/2018 | Shimada |

\* cited by examiner

FIRST OPERATION CONDITION

SECOND OPERATION CONDITION

MEMORY CONTROLLER, MEMORY DEVICE AND MEMORY SYSTEM HAVING IMPROVED THRESHOLD VOLTAGE DISTRIBUTION CHARACTERISTICS AND RELATED OPERATING METHODS

CROSS-REFERENCE TO RELATED APPLICATION

This application is a continuation of and claims priority to U.S. patent application Ser. No. 16/661,351 filed on Oct. 23, 2019, which claims the benefit of Korean Patent Application No. 10-2019-0044478, filed on Apr. 16, 2019, in the Korean Intellectual Property Office, the disclosure of each of which is incorporated herein in its entirety by reference.

BACKGROUND

The inventive concept relates to a memory controller and memory system, and more particularly, to a memory controller and memory system providing an improved threshold voltage distribution characteristic and a related operating method.

Memory systems often include a memory controller and one or more memory devices, such as non-volatile memory devices. Non-volatile memory devices, such as flash memory devices, are widely used in cellular phones, digital cameras, personal digital assistants (PDAs), mobile computer devices, stationary-type computer devices, and other devices.

Flash memory devices include a plurality of blocks of memory cells, where each of the plurality of blocks comprise a plurality of pages of memory cells. In the flash memory device, an erase program interval (EPI) of a block may correspond to the time period elapsed after an erase operation has been performed on the block until a program operation of the block is to be performed. In view of the characteristics of some flash memory devices, in a case where the EPI is long, a threshold voltage distribution characteristic thereof may be degraded, and as a result, the reliability of data may be degraded.

SUMMARY

The inventive concept provides a memory controller, a non-volatile memory device and a memory system capable of decreasing or preventing degradation of the reliability of data in spite of a relatively long erase program interval (EPI) and related operations of the same.

According to an aspect of the inventive concept, there is provided an operating method of a memory system comprising a memory device having a plurality of blocks. As a write request of data with respect to a first block is received, an erase program interval (EPI) denoting a time period elapsed after an erasure of the first block may be determined. In response to the determined EPI being equal to or less than a reference time, data may be programmed to the first block based on a first operation condition selected from among a plurality of operation conditions and in response to the determined EPI being greater than the reference time, the data may be programmed to the first block based on a second operation condition selected from among the plurality of operation conditions.

According to another aspect of the inventive concept, a memory controller configured to control a memory device comprising a plurality of blocks may comprise a host interface configured to communicate with a host and receive a data write request and an address from the host, an erase program interval (EPI) detector configured to determine an EPI denoting a time period elapsed after erasure of a first block of the plurality of blocks of the memory device that is subject to the data write request, and a control information generator configured to output, to cause data to be written to the first block according to one operation condition selected from among a plurality of operation conditions, control information indicating the one operation condition selected based on the determined EPI.

According to another aspect of the inventive concept, a memory system comprises a memory device having a plurality of blocks, wherein the memory device comprises a voltage generator configured to generate a program voltage and a verify voltage for use in a write operation with respect to the plurality of blocks and control logic configured to set, when a write request of data with respect to a first block is received, a level of at least one of the program voltage and the verify voltage in response to an erase program interval (EPI) denoting a time period elapsed after erasure of the first block.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
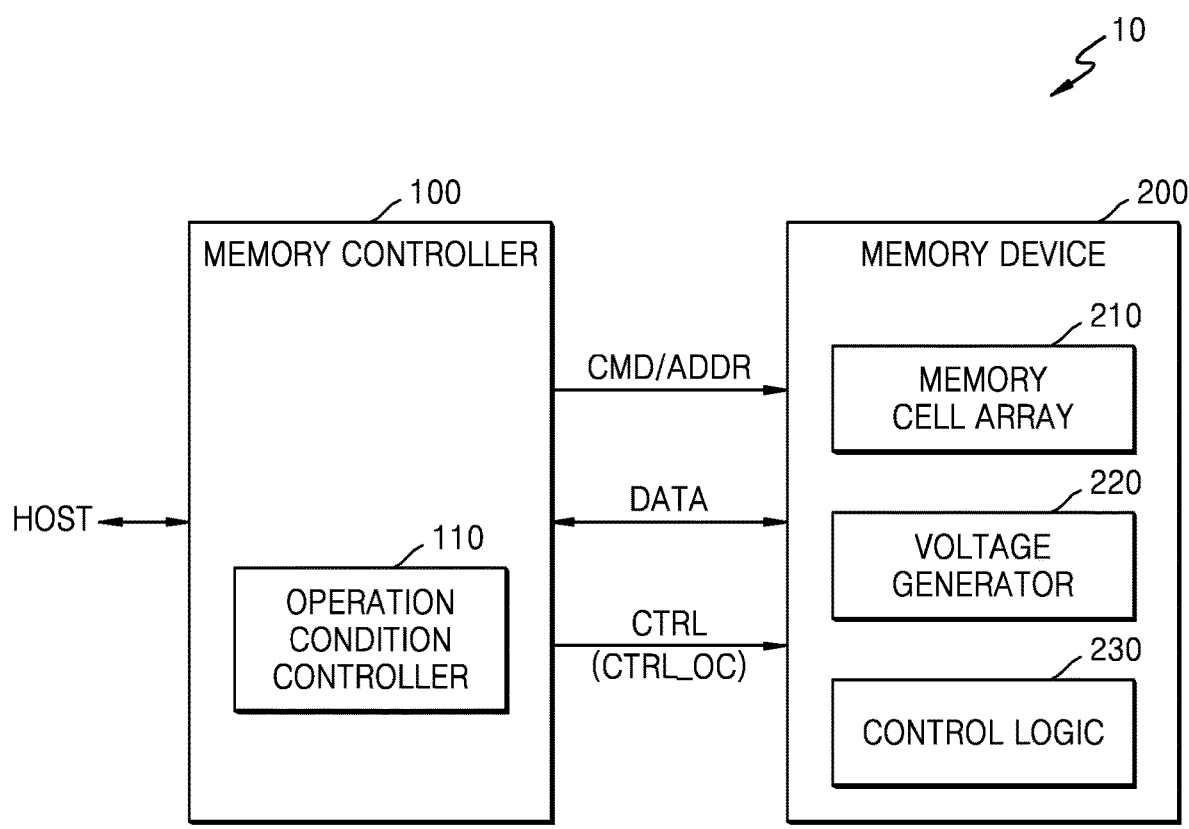
FIG. 1 is a block diagram of a memory system according to an embodiment.

FIG. 1 is a block diagram of a memory system 10 according to an embodiment. Referring to FIG. 1, the memory system 10 may include a memory controller 100 and a memory device 200, and the memory device 200 may include a memory cell array 210, a voltage generator 220, and control logic 230 (a logic circuit to control internal operations of the memory device 200).

According to an embodiment, the memory device 200 may be a non-volatile memory device. In some embodiments, the memory system 10 may be implemented as an internal memory embedded in an electronic device, and for example, may be an embedded universal flash storage (UFS) memory device, an embedded multi-media card (eMMC), or a solid state drive (SSD). In some embodiments, the memory system 10 may be implemented as an external memory removable from an electronic device, and for example, may be a UFS memory card, a Compact Flash (CF) card, a Secure Digital (SD) card, a Micro Secure Digital (Micro-SD) card, a Mini Secure Digital (Mini-SD) card, an extreme Digital (xD) card, a memory stick or an external solid state drive.

The memory controller 100 may control the memory device 200 and read data stored in the memory device 200 or write (or program) data to the memory device 200 (e.g., in response to a read/write request received from a host HOST). Specifically, the memory controller 100 may control write, read, and erase operations of the memory device 200 by providing an address ADDR, a command CMD, and a control signal CTRL to the memory device 200. Also, data DATA to be written to the memory device 200 and data DATA read from the memory device 200 may be exchanged between the memory controller 100 and the memory device 200.

The memory cell array 210 may include a plurality of memory cells, and for example, the plurality of memory cells may be flash memory cells. However, embodiments are not limited thereto. For example, in some embodiments, the plurality of memory cells may be resistive memory cells such as resistive RAM (ReRAM), phase change RAM (PRAM), or magnetic RAM (MRAM).

The memory cell array 210 may include a plurality of blocks. Each of the plurality of blocks may include a plurality of pages, and each of the plurality of pages may include a plurality of memory cells. Each page of memory cells may be uniquely identified by a corresponding row address, that when decoded by a row decoder, selects a word line corresponding to the page (e.g., to provide access to the memory cells of the page). In the memory cell array 210, an erase operation of data may be performed for each block. For example, an erase operation may perform erase operations in units of a block, such that a block of memory cells are erased in the same erase operation. The block of memory cells may be the minimum erase unit in the memory cell array 210 and may be formed by all pages arranged within a certain physical area within the memory cell array 210 (e.g., a certain number of rows of memory cells arranged side by side in a column direction). Write and read operations of data may be performed for each page (e.g., in units of a page). For example, the memory device 200 may perform an erase operation for each block by referring to a block address portion of the address ADDR received from the memory controller 100 and may perform write and read operations for each page by referring to a row address portion of the address ADDR received from the memory controller 100.

The voltage generator 220 may generate various types of voltages for performing the write/read operations and the erase operation described above. For example, a data write operation may be performed using an incremental step pulse programming (ISPP) voltage, and the voltage generator 220 may generate an ISPP voltage including a plurality of voltage pulses and provide the ISPP voltage to the memory cell array 210. As an example of operation, a write operation of a page of data to a physical page of memory cells may be performed by a plurality of program operations using a plurality of voltage pulses. Accordingly, reference to write and program operations of data may be mixed and should be understood in context. After each program operation is performed, a verify operation may be performed to determine pass or fail of the program operation, and the voltage generator 220 may generate a verify voltage for use in the verify operation and provide the verify voltage to the memory cell array 210. Also, the voltage generator 220 may generate a read voltage for use in a read operation of data and provide the read voltage to the memory cell array 210, and may generate an erase voltage having a high voltage level and provide the erase voltage to the memory cell array 210.

The control logic 230 may control overall operations of the memory device 200. For example, the control logic 230 may control the voltage generator 220, and levels of various voltages generated in the voltage generator 220 may change based on such control by the control logic 230. Also, the threshold voltage distribution of the memory cells of the memory cell array 210 may be adjusted according to a voltage generated from the voltage generator 220, and according to example embodiments, levels of various voltages generated in the voltage generator 220 may be changed according to a result of determining an erase program interval (EPI) to decrease or prevent degradation of data reliability resulting from an EPI characteristic corresponding to a time period between an erase time and a program time.

In view of characteristics of a flash memory device, particularly, vertical NAND flash memory (VNAND) including a three-dimensional memory block, when the EPI (corresponding to a time between erasure and programming) is long, data reliability may be degraded. For example, during the time period after an erase operation is performed until a program operation is to be performed, hole spreading to a space region may occur, and when data is programmed after a relatively long EPI state, electrons may recombine with holes after the program operation is performed, and accordingly, as threshold voltage distribution is shifted, a distribution characteristic thereof may be degraded. For example, when data is programmed after a long EPI state, the threshold voltage distribution of the memory cells may be more easily and more quickly reduced (shifted in a direction of decreasing a threshold voltage level (e.g., a left direction with respect to FIGS. 9 and 11A), a window margin may be small and a distribution characteristic thereof may be degraded compared to a case where data is programmed after a short EPI state. When a block determined as having a long EPI is not used, to prevent reliability from being degraded due to the EPI described above, storage space of the memory device 200 may be inefficiently used and frequent garbage collection operations may be caused, and thus, the life of the memory device 200 may be shortened.

According to an example embodiment, an EPI of a block may be determined as part of a write operation and a condition (for example, an operation condition) for performing various memory operations on the block (during the write operation and/or during subsequent read operations) may be changed according to a detection result, and thus, the degradation of the reliability of data may be decreased or prevented even when data is programmed after a long EPI state. For example, in regard to a write operation of a first block, an EPI corresponding to a time period after an erase time of the first block until a program time may be determined, and when the EPI of the first block is equal to or less than a reference time (e.g., a set reference time value), data may be written to the first block according to a first operation condition. On the other hand, when the EPI of the first block is greater than the reference time, data may be written to the first block according to a second operation condition. Accordingly, in the first block, the threshold voltage distribution of a page having data written according to the first operation condition and the threshold voltage distribution of a page having data written according to the second operation condition may be different from each other.

It will be apparent that the EPI of a block determined during a write operation may not measure the time to the physical programming of the memory cells (as the physical programming of the memory cells occurs after determining the EPI since the EPI may affect how the physical programming of the memory cells is performed). Rather, the program time of a block used to determine the EPI of a block may corresponding to a time of the overall programming operation of the block, such as when the block is selected for programming, such as being targeted for a programming by having its address associated with a write command. For example, the EPI may be determined upon the memory controller 100 generating a write command with an address (e.g., block address) identifying the block, or may be determined upon the memory device 200 receiving a write command with an address identifying the block. Thus, the EPI may correspond to the time period that has elapsed after the most recent erasure of the block selected for physical programming as part of the overall programming operation.

According to an embodiment, the memory controller 100 may include an operation condition controller 110, and the operation condition controller 110 may determine the EPI of the first block and may generate the control information CTRL_OC for controlling an operation condition for the first block according to a detection result and provide the control information CTRL_OC to the memory device 200. The control logic 230 may store various pieces of setting information for writing data to the first block according to various operation conditions and may control an internal operation of the memory device 200 by providing setting information corresponding to the first operation condition or the second operation condition according to the control information CTRL_OC. For example, the control logic 230 may control the operation of voltage generator 220 differently according to the control information CTRL_OC, and levels of a program voltage (for example, ISPP voltage) for data writing and/or a verify voltage may be set differently under the first operation condition and the second operation condition.

As described above, according to an example embodiment, when data is written according to the second operation condition, a threshold voltage distribution thereof may be increased (or shifted to the right or in a direction of increasing a threshold voltage level) as compared to a case where data is written according to the first operation condition, and/or a width of the threshold voltage distribution thereof may be adjusted to become narrow as compared to a case where data is written according to the first operation condition. Accordingly, degradation of a threshold voltage distribution characteristic, which may occur after a long EPI state, may be balanced, and thus, the reliability of data may be improved.

According to an example embodiment, when a read condition as an operation condition is changed based on a result of determining an EPI, a level of read voltage under the first operation condition and that of read voltage under the second operation condition may be set differently. For example, information of an EPI determined during a write operation of data may be stored in the memory controller 100 or the memory device 200, and the stored EPI information (or stored EPI) may be referred to during a read operation of data. The EPI information may be stored for each page of a block or for memory groupings in units other than pages as described herein. Assuming that a read operation is performed on a first page of the first block, when the stored EPI of the first page of the first block is relatively short, a level of first read voltage set under the first operation condition may be relatively high, whereas, when the stored EPI of the first page of the first block is relatively long, a level of second read voltage set under the second operation condition may be relatively low. When data is written after a long EPI state, as the threshold voltage distribution of the memory cells is reduced, a threshold voltage distribution characteristic thereof may be degraded; however, degradation of the reliability of data may be decreased or prevented based on change of the level of read voltage as an operation condition.

In some embodiments, the operation condition denotes conditions of various voltage levels applied to a core (for example, a memory cell core) including a plurality of blocks and thus may be referred to as a core condition. Also, the operation condition may be include at least one of a program condition for a program operation to be performed during a write operation, a verify condition for verification of the program operation, and a read condition related to a read operation on a block.

At least one of the various memory operations described above as an operation of preventing characteristic degradation due to a long EPI may change. For example, only one of the program condition, the verify condition, and the read operation may be changed based on a result of determining an EPI. Alternatively, as a modifiable example, two or more or all of the program condition, the verify condition, and the read operation may be changed based on a result of determining an EPI.

Figure 2:
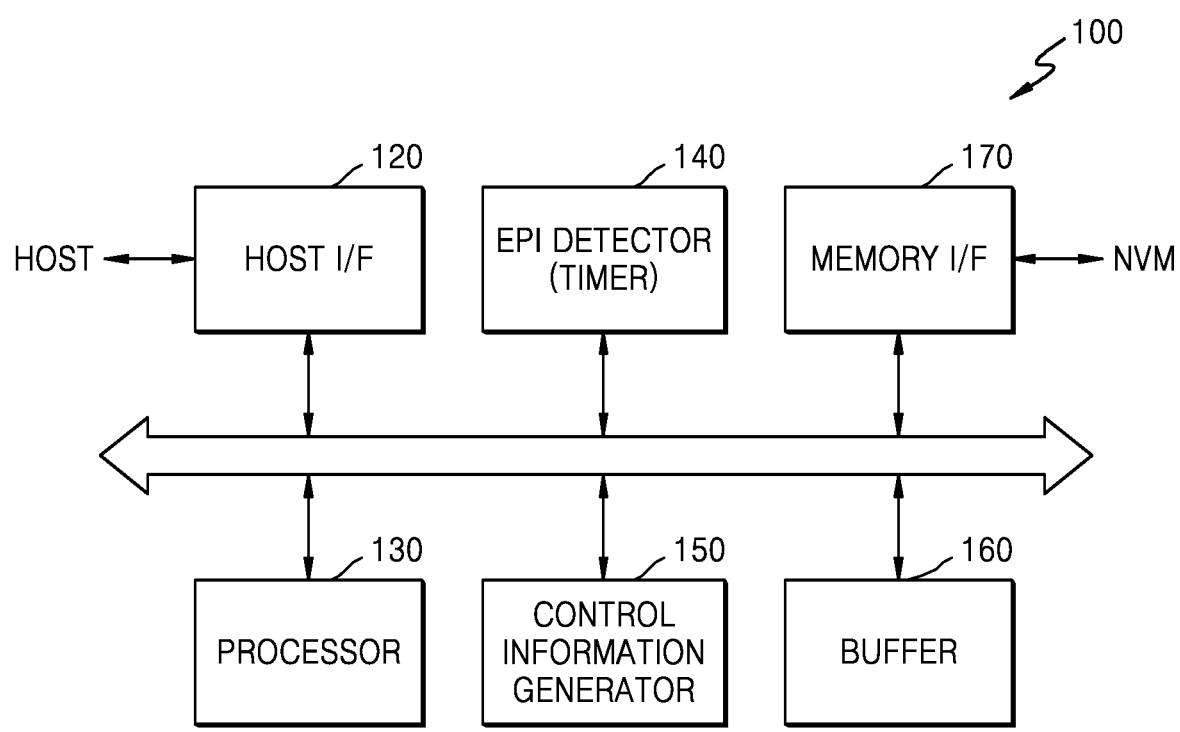
FIG. 2 is a block diagram of an implementation example of a memory controller of FIG. 1.

FIG. 2 is a block diagram of an implementation example of the memory controller 100 of FIG. 1.

Referring to FIGS. 1 and 2, the memory controller 100 may include a host interface 120, a processor 130, an EPI detector 140, a control information generator 150, a buffer 160, and a memory interface 170. Although not illustrated in FIG. 2, the memory controller 100 may further include other various components such as RAM for temporarily storing various pieces of information and ROM for storing various pieces of information in a non-volatile manner. Each of the several pieces of information may provide values defining a corresponding operating condition (e.g., one or more of a program voltage, verify voltage, etc.) and may be selected based on the determined EPI. The RAM may be used as a working memory, and the processor 130 may control overall operations of the memory controller 100 by driving firmware loaded to the RAM. The RAM may be implemented as various types of memory, and for example, may be implemented as at least one of cache memory, DRAM, SRAM, PRAM, and a flash memory device. As an example of firmware, a flash translation layer (FTL) may be loaded to the RAM, and various functions related to a flash memory operation may be performed by driving the FTL.

The host interface 120 provides physical connection between the host HOST and the memory system 10 to facilitate communication therebetween. For example, the host interface 120 may include various interface methods such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), SD card, multimedia card (MMC), eMMC, and CF card interface.

The memory interface 170 provides physical connection between the memory controller 100 and the memory device 200 and facilitates communication therebetween. For example, the command CMD, the address ADDR, and the data DATA may be exchanged between the memory controller 100 and the memory device 200 via the memory interface 170. Data subject to a write request received from the host HOST and data read from the memory device 200 may be temporarily stored in the buffer 160.

According to embodiments, the memory controller 100 may determine EPIs of the blocks of the memory device 200, and based on the EPI, may control an operation condition related to a write operation and/or a read operation. The operation condition controller 110 illustrated in FIG. 1 may include various components, and for example, the operation condition controller 110 may include an EPI detector 140 and a control information generator 150.

The EPI detector 140 may include one or more timers and may determine respective EPIs of the blocks included in the memory cell array 210 of the memory device 200. The EPI detector 140 may include various timers capable of measuring time, and for example, the EPI detector 140 may include a counter when the EPI detector 140 measures time based on clock counting. According to an example embodiment, the memory cell array 210 may include a plurality of blocks, and a timer may be provided for each block. Alternatively, the memory system 10 may be implemented such that one timer is shared by the plurality of blocks, or a timer for each group of groups of several blocks, or the memory system 10 may be implemented such that a timer is individually provided for each page (or for each group of groups of several pages) with respect to a plurality of pages included in each block.

Based on a detection result of the EPI detector 140, the control information generator 150 may generate the control information CTRL_OC described above. The control information CTRL_OC may include information for indicating one of a plurality of operation conditions. According to some embodiments, the memory device 200 may store setting information related to the plurality of operation conditions and may perform data write and/or read operation according to the control information CTRL_OC received from the memory controller 100.

Figure 3:
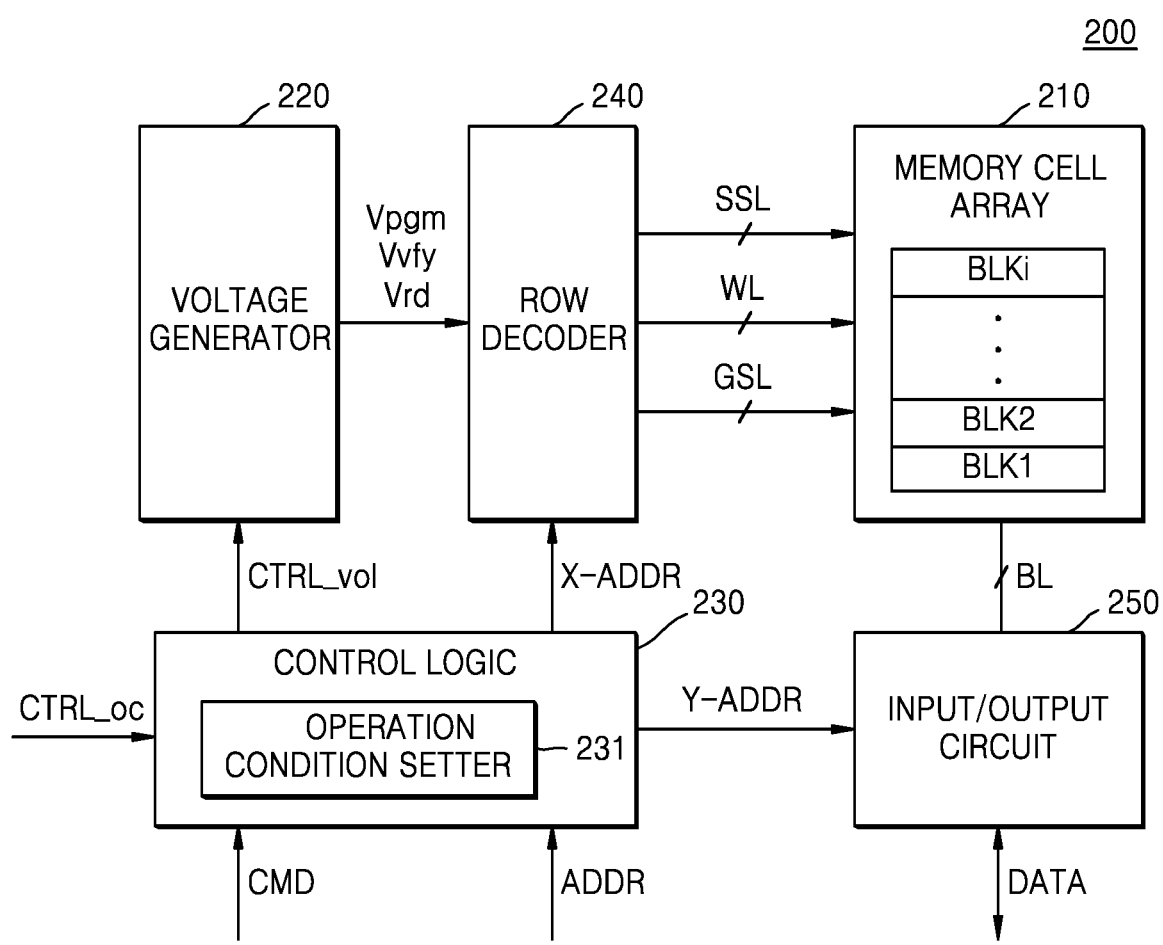
FIG. 3 is a block diagram of an implementation example of a memory device of FIG. 1.

FIG. 3 is a block diagram of an implementation example of a memory device 200 of FIG. 1. FIG. 3 illustrates an implementation example of a flash memory device as a memory device.

Referring to FIGS. 1 to 3, the memory device 200 may include the memory cell array 210, the voltage generator 220, the control logic 230, a row decoder 240, and a page buffer 250. Although not illustrated in FIG. 3, the memory device 200 may further include other various components related to a memory operation, such as a data input/output circuit, an input/output interface, or the like.

The memory cell array 210 may include a plurality of blocks BLK1 to BLKz, and memory cells of the plurality of blocks BLK1 to BLKz may be connected to word lines WL, string selection lines SSL, ground selection lines GSL, and bit lines BL. The memory cell array 210 may be connected to the row decoder 240 via the word lines WL, the string selection lines SSL, and the ground selection lines GSL and may be connected to the page buffer 250 via the bit lines BL. Each of the memory cells may store one or more bits, and for example, each memory cell may correspond to a multi-level cell (MLC), a triple level cell (TLC), or a quad level cell (QLC).

In an embodiment, the memory cell array 210 may include a two-dimensional memory cell array, and the two-dimensional memory cell array may include a plurality of cell strings arranged in row and column directions. According to an embodiment, the memory cell array 210 may include a three-dimensional memory cell array, and the three-dimensional memory cell array may include a plurality of cell strings, and each cell string may include memory cells respectively connected to word lines vertically stacked over a substrate. U.S. Pat. Nos. 7,679,133, 8,553,466, 8,654,587, 8,559,235, and US 2011/0233648, which provide exemplary details of structure and operation of three-dimensional memory cell arrays (including a plurality of levels and having word lines and/or bit lines shared between the plurality of levels) are incorporated herein by reference.

Based on the command CMD, the address ADDR, and the control signal CTRL received from the memory controller 100, the control logic 230 may output various internal control signals for programming data to the memory cell array 210 or reading data from the memory cell array 210. For example, the control logic 230 may output a voltage control signal CTRL_vol for controlling levels of various voltages generated in the voltage generator 220, may provide a row address X-ADDR to the row decoder 240, and may provide a column address Y-ADDR to the page buffer 250. Also, the voltage generator 220 may generate various voltages for use in the memory device 200, and for example, may generate a program voltage Vpgm for use in a write operation, a verify voltage Vvfy, and a read voltage Vrd for use in a read operation.

Also, the control logic 230 may include an operation condition setter 231, and according to some embodiments, setting information related to a plurality of operation conditions may be stored in the operation condition setter 231. The control logic 230 may select one or more operation conditions in response to the control information CTRL_OC and may output the voltage control signal CTRL_vol based on setting information corresponding to the selected operation condition, thereby controlling levels of various voltages. As in the previous embodiment, a level of one or more of the program voltage Vpgm, the verify voltage Vvfy, and the read voltage Vrd may be changed according to the selected operation condition. FIG. 3 illustrates the operation condition setter 231 included in the control logic 230. However, embodiments described herein are not limited thereto, and the memory device 200 may be implemented such that the operation condition setter 231 is outside the control logic 230.

Figure 4:
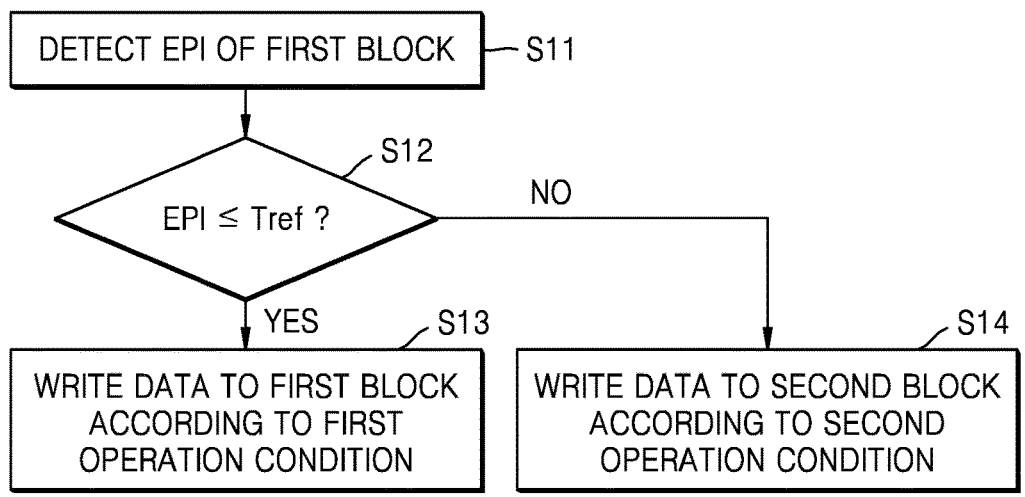
FIG. 4 is a flowchart of an operating method of a memory system, according to an example embodiment.

FIG. 4 is a flowchart of an operating method of a memory system, according to an example embodiment. In FIG. 4, the memory system includes a memory controller and a memory device and an example of performing a write operation on a first block of the memory device is illustrated.

Referring to FIG. 4, the memory controller may receive a write request from a host and may determine an EPI of the first block to which data is to be written (in operation S11). For example, the memory controller may include a timer, and the timer may determine (e.g., measure or track) as the EPI the time period elapsed since the most recent erase operation was performed on the first block. Also, whether the determined EPI is equal to or less than a reference time Tref or not may be determined (in operation S12), and when the determined EPI is equal to or less than the reference time Tref, it may be determined that a relatively short time has elapsed since the erase operation was performed on the first block, and in this regard, data may be written to the first block according to a first operation condition. On the other hand, when the determined EPI is greater than the reference time Tref, it may be determined that a relatively long time has elapsed since the erase operation was performed on the first block, and in this regard, data may be written to the first block according to a second operation condition.

During a data writing process, the first operation condition may include a program voltage level and a verify voltage level, and at least one of the program voltage level and the verify voltage level under the first operation condition may be different from a level under the second operation condition. According to an embodiment, the threshold voltage distribution of a case where data is written according to the second operation condition may be increased as compared to the case where data is written according to the first operation condition.

Figure 5:
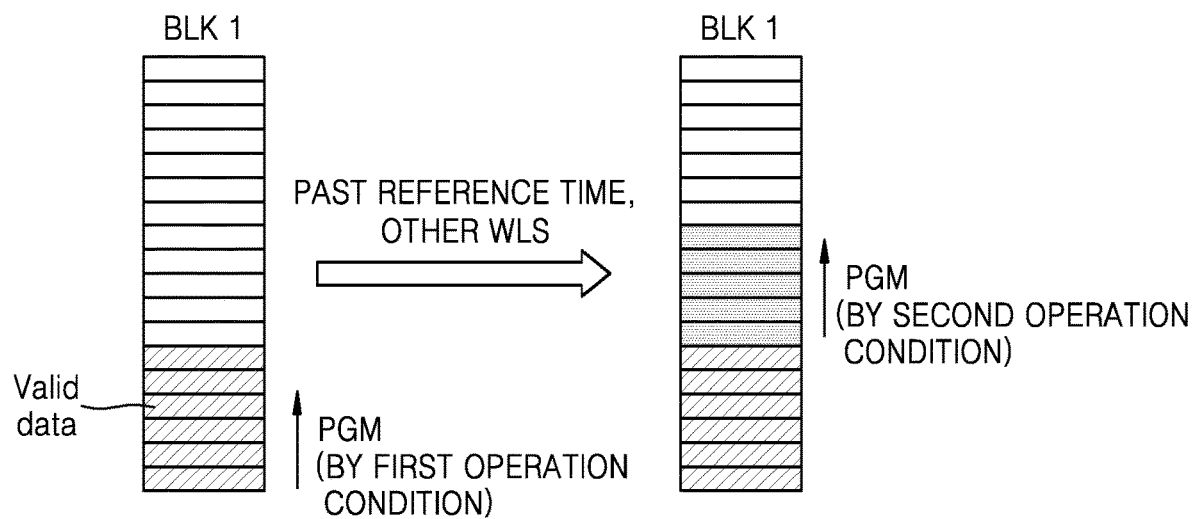
FIGS. 5 and 6 are concept diagrams of an example of writing data to a block, according to an example embodiment.
Figure 6:
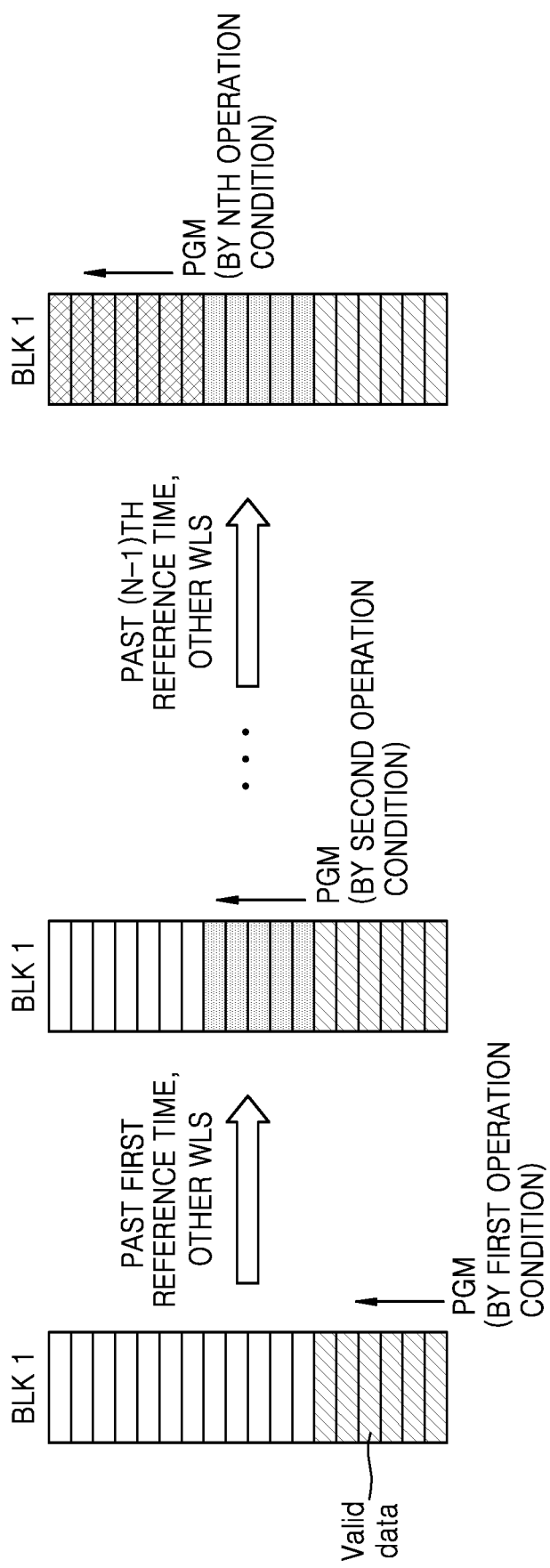

FIGS. 5 and 6 are concept diagrams of an example of writing data to a block, according to an example embodiment.

Referring to FIG. 5, when writing of data with respect to the first block BLK1 is requested, an EPI for the first block BLK1 may be determined, and the determined EPI may be compared with a reference time. As the EPI of the first block BLK1 is equal to or less than the reference time, data may be written to one or more pages based on a first operation condition.

After data is written to some pages of the first block BLK1 according to the first operation condition, writing to the first block BLK1 may be requested again after time elapses. Accordingly, the EPI of the first block BLK1 may be determined again, and the EPI may exceed the reference time at a time when the EPI is determined again. Accordingly, data may be written to some other pages of the first block BLK1 based on a second operation condition.

Referring to FIG. 6, as a plurality of operation conditions, first to n operation conditions may be defined. In this case, a plurality of reference times may be defined, and an EPI determined with respect to the first block BLK1 may be compared with the plurality of reference times.

As the EPI of the first block BLK1 is equal to or less than a first reference time, data may be written to some pages of the first block BLK1 based on a first operation condition. Afterwards, when a write operation is performed again on the first block BLK1, the EPI of the first block BLK1 may have a value greater than the first reference time and equal to or less than a second reference time, and in this regard, data may be written to some other pages of the first block BLK1 based on a second operation condition. Similarly, as time elapses, an operation condition for the first block BLK1 may change, and when the EPI is greater than a $(n-1)^{th}$ reference time, data may be written to the other pages of the first block BLK1 based on a $n^{th}$ operation condition.

The above-described reference times may be set variously. For example, the above-described reference times may have magnitudes greater than 10 minutes. In some examples, above-described reference times may be less than 100 minutes, such as less than one hour. The criterion of time may proportionally increase, for example, the first reference time may correspond to 25 minutes and the second reference time may correspond to 50 minutes. However, one or more embodiments described herein are not limited thereto, and the reference times may be set according to various methods.

FIGS. 7 to 11B are diagrams of an example of changing operating conditions, according to example embodiments. FIGS. 7 to 11B illustrate an example of changing a write condition of data according to a result of determining an EPI.

Figure 7:
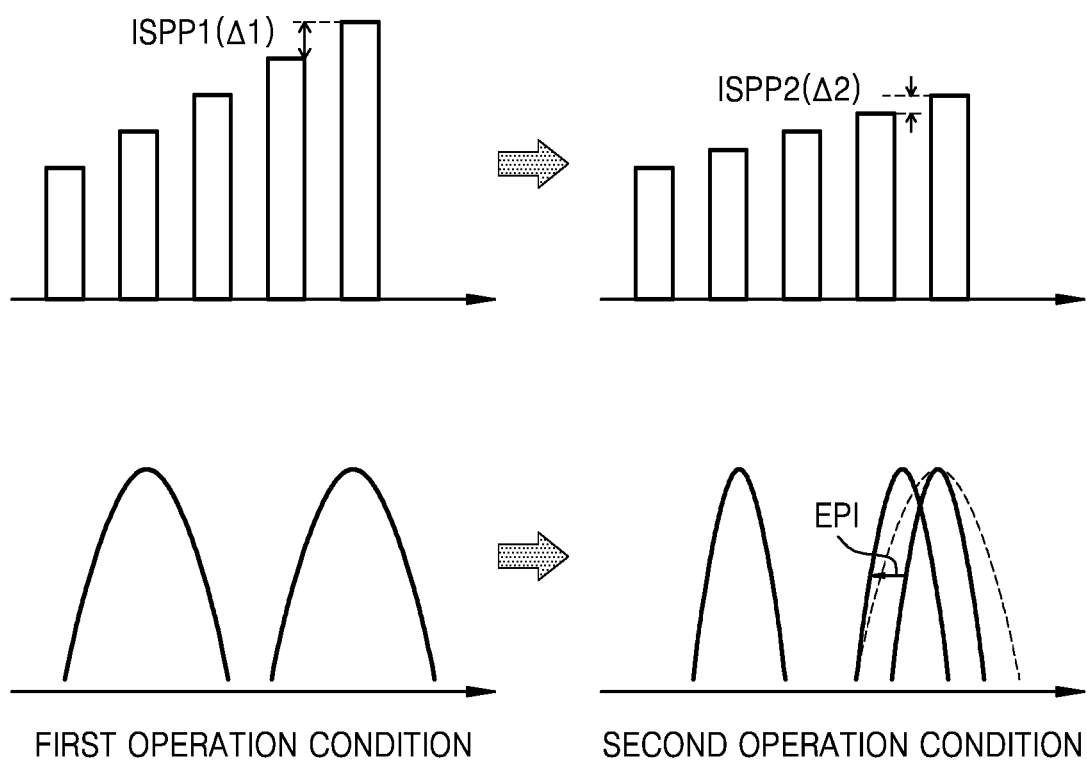
FIGS. 7 to 10, 11A and 11B are diagrams of an example of changing operating conditions, according to example embodiments.

Referring to FIG. 7, an operation condition may be changed according to a method of changing a level of ISPP voltage to write data to a block. For example, when an EPI of the block is equal to or less than a reference time, an ISPP voltage ISPP1 according to a first operation condition (for example, a normal operation condition) may be generated, and on the other hand, when the EPI of the block is greater than the reference time, an ISPP voltage ISPP2 according to a second operation condition (for example, a changed operation condition) may be generated.

The ISPP voltage may include a plurality of voltage pulses, levels of which gradually increase, and according to an embodiment, a voltage increase $\Delta V2$ of the ISPP voltage ISPP2 under the second operation condition may be small compared to a voltage increase $\Delta V1$ of the ISPP voltage ISPP1 under the first operation condition. Also, the number of voltage pulses of the ISPP voltage ISPP2 under the second operation condition may be greater than the number of voltage pulses of the ISPP voltage ISPP1 under the first operation condition. In this regard, as illustrated in FIG. 7, a width of the threshold voltage distribution of memory cells having data written according to the second operation condition may be less than that of the distribution denoted by dash lines corresponding to a result of writing data according to the first operation condition, and accordingly, characteristics of distribution may improve. That is, when memory cells have a plurality of threshold voltage distributions, a distance between the distributions may increase, and even when the threshold voltage distribution is reduced due to a long EPI, a window margin between the distributions may be sufficiently obtained. Accordingly, the reliability of data may improve.

Figure 8:
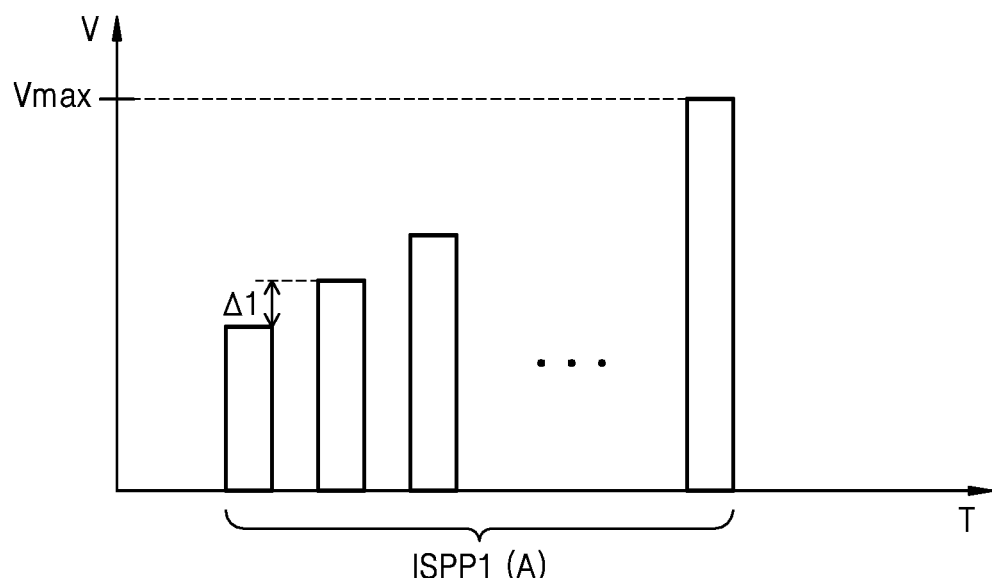
Figure 8:
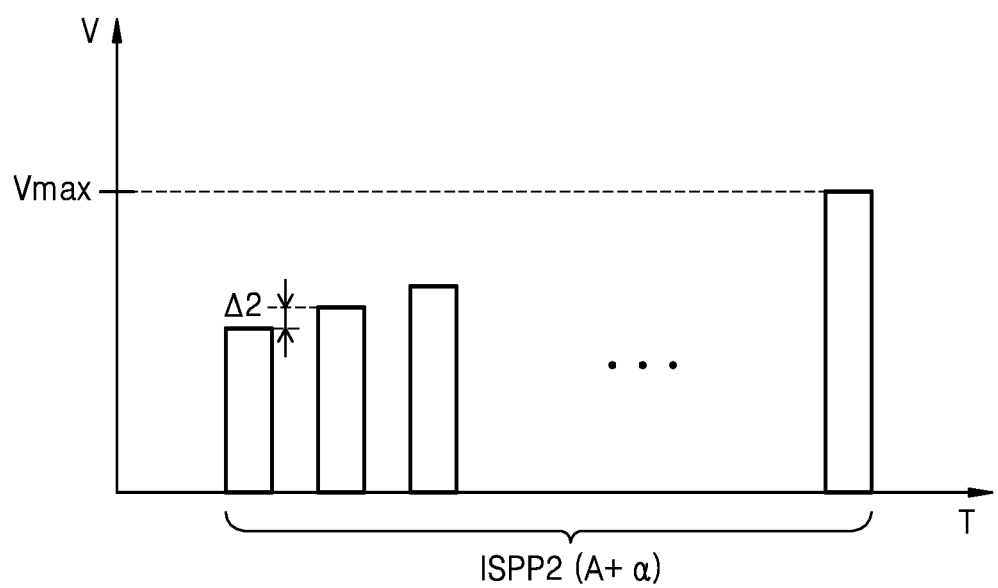

FIG. 8 illustrates characteristics of voltage pulses of ISPP voltage under a first operation condition and a second operation condition.

Referring to FIG. 8, the number of voltage pulses of the ISPP voltage ISPP1 under the first operation condition may correspond to A and a voltage increase of the ISPP voltage ISPP1 may correspond to $\Delta V1$. On the other hand, the number of voltage pulses of the ISPP voltage ISPP2 under the second operation condition, which is selected when an EPI is relatively long, may correspond to $(A+\alpha)$ and a voltage increase of the ISPP voltage ISPP2 may correspond to $\Delta V2$. The voltage increase $\Delta V1$ of the ISPP voltage ISPP1 under the first operation condition may be greater than the voltage increase $\Delta V2$ of the ISPP voltage ISPP2 under the second operation condition, and a maximum level Vmax of a voltage pulse of the ISPP voltage ISPP1 may be the same as that of a voltage pulse of the ISPP voltage ISPP2. Accordingly, the number of voltage pulses of the ISPP voltage ISPP2 under the second operation condition may be greater compared to the first operation condition. In some examples, the number of voltage pulses of the ISPP voltage ISPP1 and the number of voltage pulses ISPP voltage ISPP2 may correspond to the maximum number of voltage pulses that may be applied in programming to a particular voltage threshold of a page of memory cells. For example, the number of voltage pulses applied in programming to a particular voltage threshold level may be less than this maximum number of voltage pulses when verify operations confirm all memory cells have been properly programmed to the desired voltage threshold.

Figure 9:
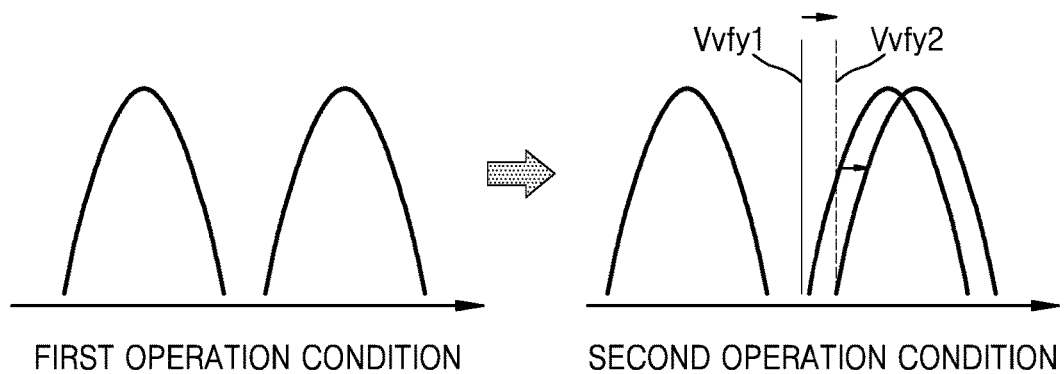

FIG. 9 illustrates an example of changing a level of verify voltage as an operation condition according to a result of determining an EPI.

Referring to FIG. 9, after a program operation is performed to write data to a block, a level of verify voltage for use in a verify operation may be changed according to a result of determining an EPI, and for example, a level of a second verify voltage Vvfy2 under a second operation condition where the determined EPI is greater than a reference time may be greater than that of a first verify voltage Vvfy1 under a first operation condition where the EPI is equal to or less than the reference time. For example, when data is written to a block having a long EPI, the distribution of threshold voltage levels may be reduced. However, since a verify operation is performed using the second verify voltage Vvfy2 having a relatively high level during a process of programming data, the distribution of threshold voltage levels may be relatively increased, and thus, the degradation of the data reliability due to the long EPI may be balanced.

According to an embodiment, the operation condition may include a program voltage (or ISPP voltage) and a verify voltage together, and in this regard, the embodiments illustrated in FIGS. 8 and 9 may be applied together to the inventive concept. For example, along with a program operation performed using an ISPP voltage, a voltage increase of which is relatively small under the second operation condition, a verify operation may be performed using a verify voltage having a relatively high voltage level. In this regard, in a case where data is written under the second operation condition, distribution of threshold voltage levels may be located on the right compared to a case where data is written according to the first operation condition, and a width of the distribution may decrease. Accordingly, degradation of the reliability of data due to a long EPI may be decreased or prevented.

Figure 10:
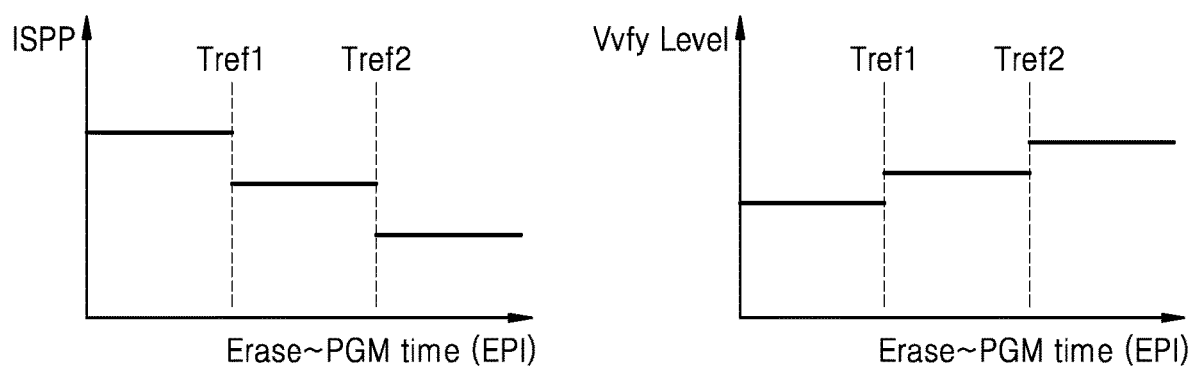

FIG. 10 illustrates an example of defining a plurality of operation conditions and changing levels of a program voltage and a verify voltage together according to a result of determining an EPI, according to an example embodiment.

Referring to FIG. 10, as an EPI between an erase time for a block and a program time increases, an operation condition thereof may change, and for example, the operation condition may change stage by stage as the EPI elapses.

When the EPI of the block is equal to or less than a first reference time Tref1, a write operation may be performed according to a first operation condition, and a level of ISPP voltage may be relatively high, which may show that an increase of voltage pulses of the ISPP voltage is relatively large. In addition, when the EPI is equal to or less than the first reference time Tref1, a level of the verify voltage Vvfy may be relatively low, and accordingly, threshold voltage distribution obtained after the write operation is completed may be located on the left compared to that obtained after the write operation is performed according to another operation condition.

As the EPI of the block elapses, when the EPI is greater than the first reference time Tref1 and equal to or less than a second reference time Tref2, the write operation may be performed according to a second operation condition, and in this case, the level of ISPP voltage may decrease, which may show that the increase of voltage pulses of the ISPP voltage may be decreased compared to the first operation condition. Also, the level of the verify voltage Vvfy under the second operation condition may be increased compared to the first operation condition, and the threshold voltage distribution may be located on the right compared to a case where the write operation is performed according to the first operation condition.

Similarly, as the EPI of the block elapses, when the EPI is greater than the second reference time Tref2, the write operation may be performed according to a third operation condition and the increase of voltage pulses of the ISPP voltage may be decreased compared to the second operation condition, whereas the level of the verify voltage Vvfy may be increased compared to the second operation condition.

Figure 11A:
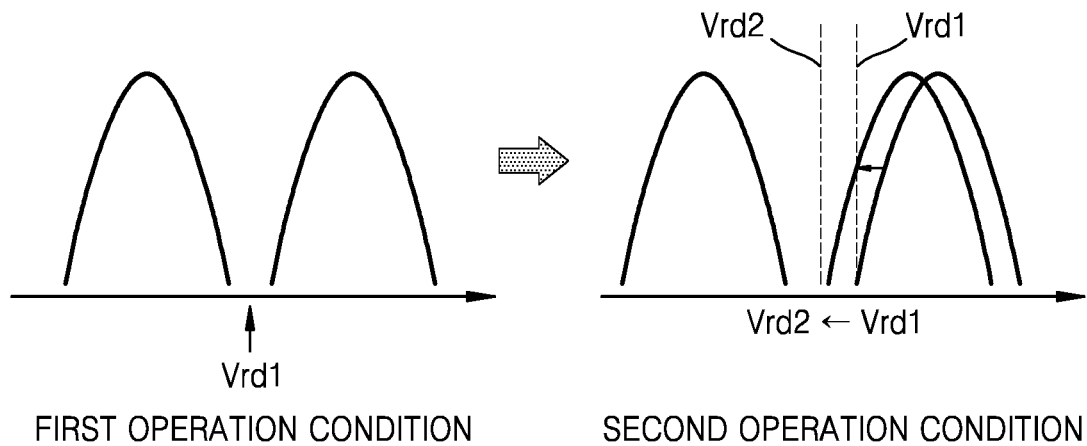
Figure 11B:
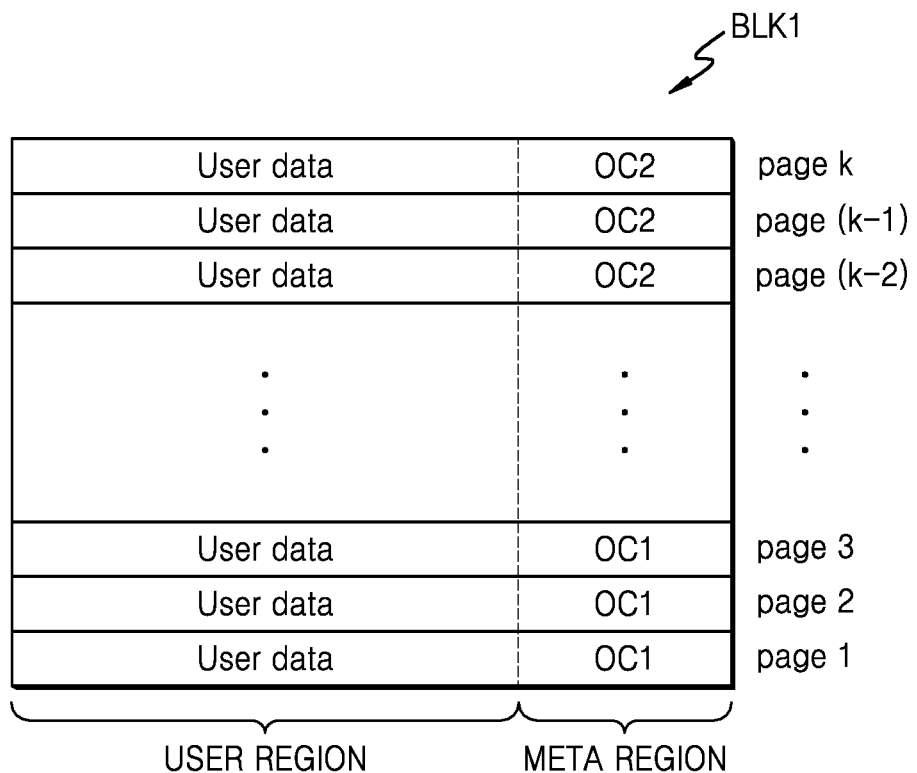

FIGS. 11A and 11B illustrate an example of changing a level of the read voltage Vrd as an example of an operation condition. For example, an example in which the first block BLK1 includes a plurality of pages page 1 to page k and data is read from the first block BLK1 is illustrated.

Referring to FIGS. 11A and 11B, according to some embodiments, an EPI may be determined when a write operation is performed on the first block BLK1, and information regarding the determined EPI may be stored in a meta region of a memory cell array (or the first block BLK1). In the meta region, the EPI corresponding to a time period between an actual erase time and a program time may be stored, or information related to an operation condition for each page may be stored. FIG. 11B illustrates an example of storing information related to operation conditions OC1 and OC2 in the meta region.

In a write operation for some pages of the first block BLK1, the first operation condition OC1 may be applied as the EPI is equal to or less than the first reference time Tref1, and in FIG. 11B, information related to the first operation condition OC1 may be stored in the meta region related to the first to third pages page 1 to page 3. On the other hand, in the write operation for some other pages of the first block BLK1, the second operation condition OC2 may be applied as the EPI is greater than the first reference time Tref1, and in FIG. 11B, information related to the second operation condition OC2 may be stored in the meta region related to the $(k-2)^{th}$ to $k^{th}$ pages page (k-2) to page k.

During a process of reading data, information of the meta region described above may be read, and a level of read voltage may be set based on the read information. According to an example embodiment, control of the level of read voltage may be performed by a memory controller reading information of the meta region within a memory device and thus controlling the memory device. Alternatively, when performing a read operation, the memory device may read information of the meta region and may change the level of read voltage by itself.

Referring to FIG. 11A, the threshold voltage distribution of memory cells having data written in a relatively short EPI may be relatively located on the right, whereas threshold voltage distribution of memory cells having data written in a relatively long EPI may be relatively located on the left. Accordingly, a level of a second read voltage Vrd2 set under a second operation condition may be lower than that of a first read voltage Vrd1 set under a first operation condition.

Although FIG. 11B illustrates an example of storing information related to operation conditions in a memory device, one or more embodiments described herein are not limited thereto, and the information related to operation conditions may be stored in a separate storage circuit within a memory controller.

An operation of balancing characteristic degradation due to an EPI by changing a read condition may be selectively performed. For example, when a method in which an operation condition is changed according to a result of determining an EPI during a process of writing data is not used, a balancing operation may be performed through change of a read condition according to some embodiments. Alternatively, as a modifiable example, changes of an operation condition during a process of writing data and an operation condition during a process of reading data may be made together. Alternatively, as another modifiable example, an EPI may be classified into a plurality of stages according to a degree of elapse of time, and in some stages, change of an operation condition in a write operation may be selectively made, whereas, in some other stages, change of an operation condition in a write operation and change of an operation condition in a read operation may be made together.

Figure 12:
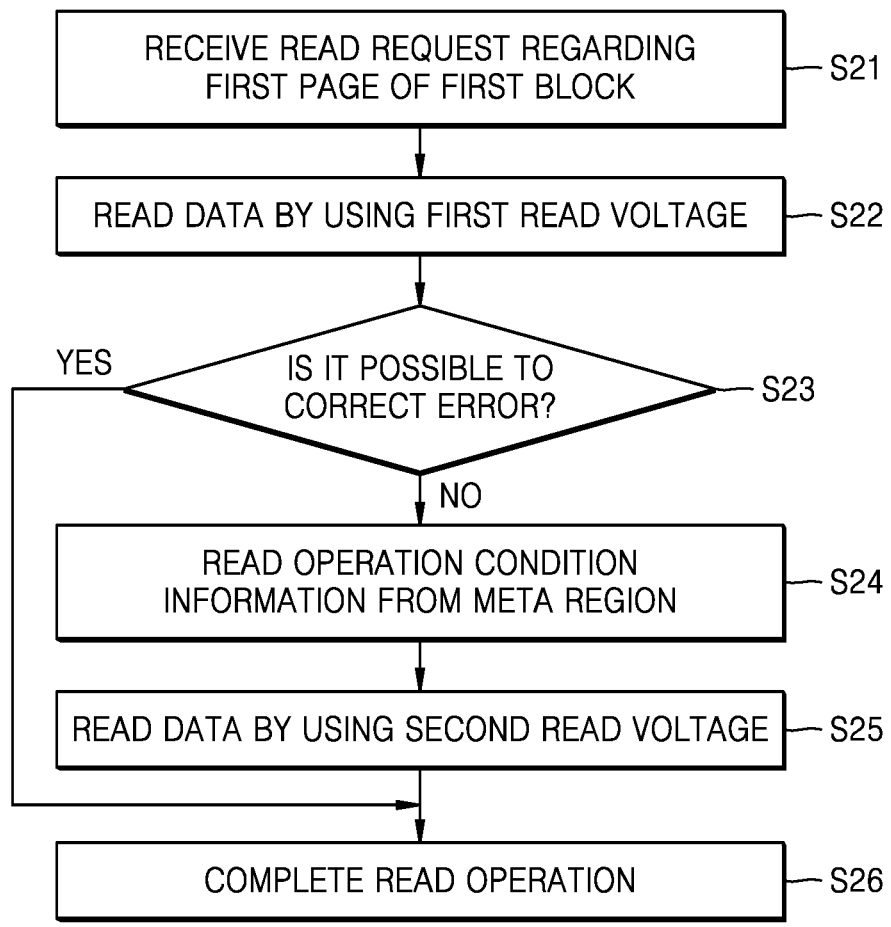
FIG. 12 is a flowchart of a read operation according to an example embodiment.

FIG. 12 is a flowchart of a read operation according to an example embodiment. FIG. 12 illustrates an example of selectively performing a process of changing an operation condition during a read operation.

First, a memory system may receive a read request regarding a first page of a first block (in operation S21), and a memory controller may control a memory device and thus may read data from the first page by using a first read voltage (in operation S22). Also, an error correction operation may be performed on the read data, and whether there is an uncorrectable error or not may be determined (in operation S23). When there is no error or when an error is correctable, the operation of reading data may be completed (in operation S26).

On the other hand, when it is impossible to correct an error of the read data, according to some embodiments, an EPI at time of writing with respect to the first page or information related to an operation condition may be read from a meta region (in operation S24), and a level of read voltage may be changed according to the read information related to an operation condition. For example, data may be read from the first page by using a second read voltage having a different level from the first read voltage described above (in operation S25), and through a read operation using the second read voltage, when there is no error or when it is possible to correct an error, the operation of reading data may be completed (in operation S26).

Figure 13:
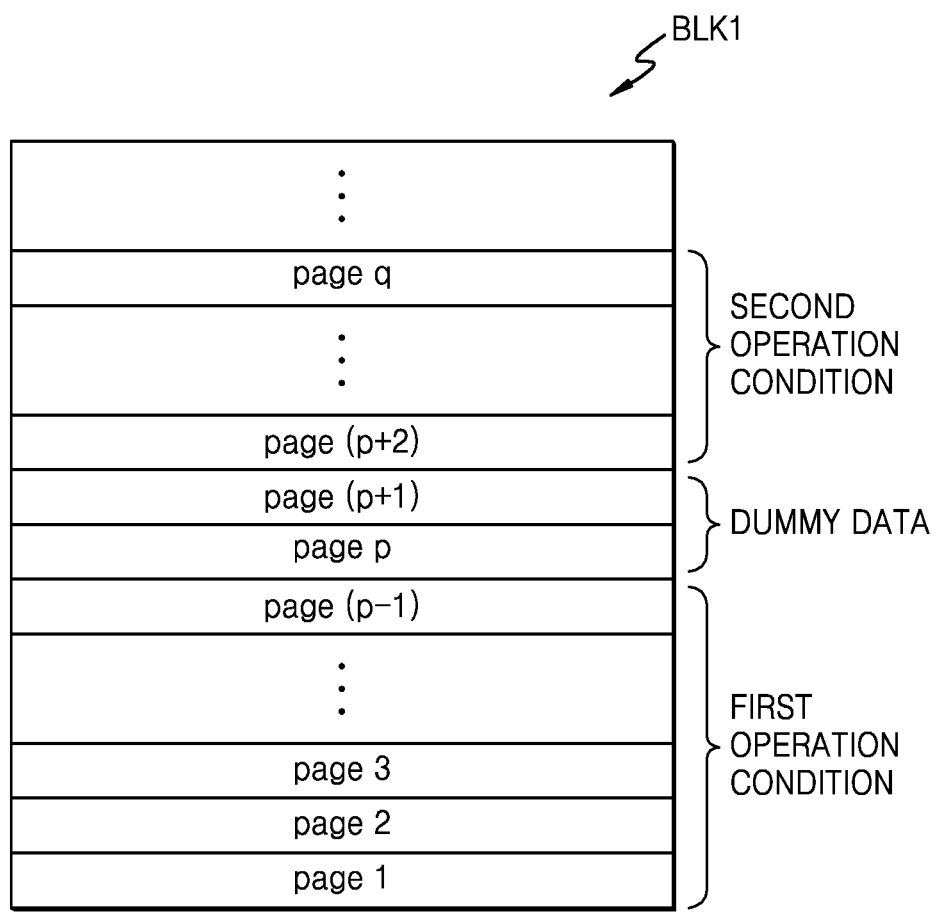
FIG. 13 is a block diagram of an example of writing data, according to a modifiable embodiment.

FIG. 13 is a block diagram of an example of writing data, according to a modifiable embodiment.

For example, in regard to the first block BLK1, when data is written to the first block BLK1, an EPI of the first block BLK1 may be determined, and an operation condition thereof may be changed according to the determined EPI. As an example, as the EPI of the first block BLK1 is equal to or less than a reference time, a first operation condition may be selected, and data may be written to some pages (for example, first to $(p-1)^{th}$ pages) of the first block BLK1 based on the first operation condition.

Afterwards, as time elapses, the EPI of the first block BLK1 may increase, and when data is written to other pages of the first block BLK1 again, the EPI of the first block BLK1 may be greater than the reference time. In this regard, the influence of hole spreading may be significant in a region adjacent to the $(p-1)^{th}$ page having data written according to the first operation condition, and accordingly, a distribution characteristic of pages adjacent to the $(p-1)^{th}$ page may be significantly degraded.

According to an embodiment, when the EPI of the first block BLK1 is greater than the reference time, dummy data having nothing to do with actual data may be written to at least one page adjacent to the $(p-1)^{th}$ page having data written according to the first operation condition described above, and data may be written according to a second operation condition starting from the next page. Although FIG. 13 illustrates an example of writing data to some pages (for example, $(p+2)^{th}$ to $q^{th}$ pages) according to the second operation condition after writing dummy data to two pages (for example, $p^{th}$ to $(p+1)$th pages), one or more embodiments described herein are not limited thereto. For example, after dummy data is written to one or more pages, a write operation according to the second operation condition may be performed.

Figure 14:
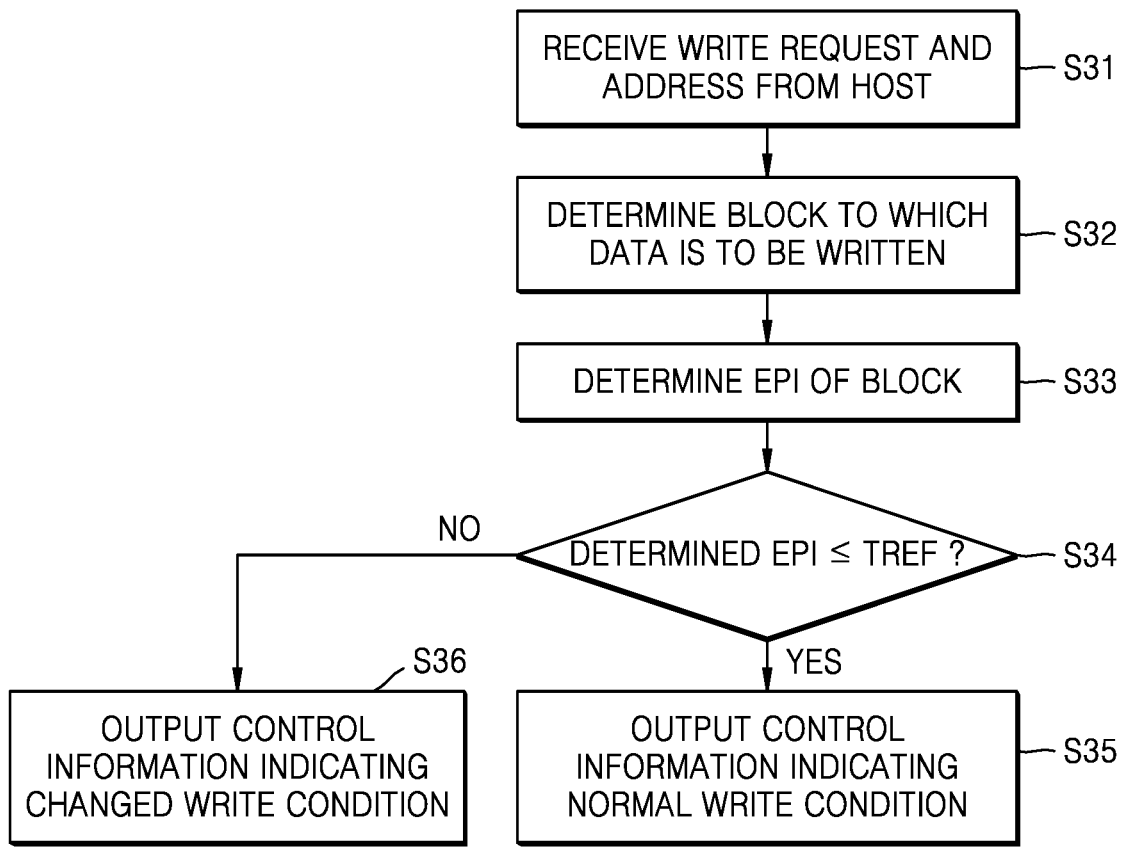
FIGS. 14 and 15 are flowcharts of an operating method of a memory controller, according to an example embodiment.
Figure 15:
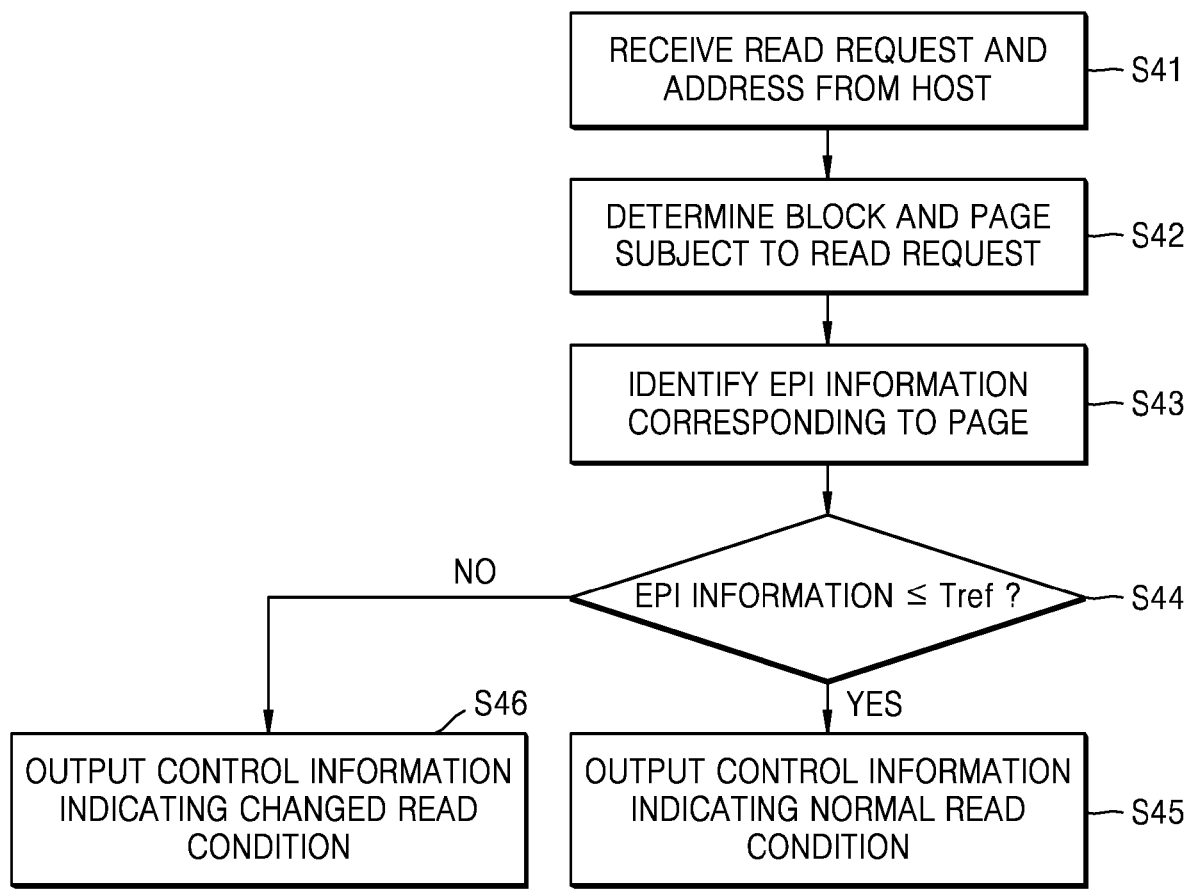

FIGS. 14 and 15 are flowcharts of an operating method of a memory controller, according to an example embodiment. FIGS. 14 and 15 illustrate an example of identifying a block based on determination of an address received from a host and thus changing an operation condition.

Referring to FIG. 14, a memory controller may control a memory device including a plurality of blocks, and for example, may receive a write request and a corresponding address from a host (in operation S31). The memory controller may convert a logical address received from the host into a physical address by driving the FTL according to some embodiments and may determine a block to which data is to be written by referring to the physical address (in operation S32). Also, the memory controller may include a plurality of timers for determining an EPI, and when one timer is arranged to correspond to one block, an EPI of the determined block may be determined by referring to a value of a timer corresponding to the determined block (in operation S33).

According to some embodiments, the determined EPI may be compared with the reference time Tref (in operation S34), and when the determined EPI is equal to or less than the reference time Tref, the memory controller may generate control information indicating a normal write condition and output the control information to the memory device (in operation S35). The normal write condition may correspond to a first write condition in some embodiments, and accordingly, a level increase of voltage pulses of ISPP voltage in the normal write condition may be relatively large, and a level of verify voltage may be relatively low. On other hand, when the determined EPI is greater than the reference time Tref, the memory controller may generate control information indicating a changed write condition and output the control information to the memory device (in operation S36). A level increase of voltage pulses of ISPP voltage in the changed write condition may be relatively small, and a level of verify voltage may be relatively high.

FIG. 15 illustrates an example of changing an operation condition by changing a level of read voltage.

Referring to FIG. 15, a memory controller may receive a read request and a corresponding address from a host (in operation S41), and the memory controller may determine a block and a page subject to the data read request, based on the received address (in operation S42). EPI information determined during a process of writing data to the page may be stored in the memory controller or a memory device, and the EPI information corresponding to the page may be identified during a process of reading data (in operation S43).

Based on the identified EPI information, whether the EPI is equal to or less than the reference time Tref or not during the process of writing data to the page may be determined (in operation S44), and when the identified EPI is equal to or less than the reference time Tref, the memory controller may generate control information indicating a normal read condition and output the control information to the memory device (in operation S45). On the other hand, when the identified EPI is greater than the reference time Tref, the memory controller may generate control information indicating a changed read condition and output the control information to the memory device (in operation S46).

Figure 16A:
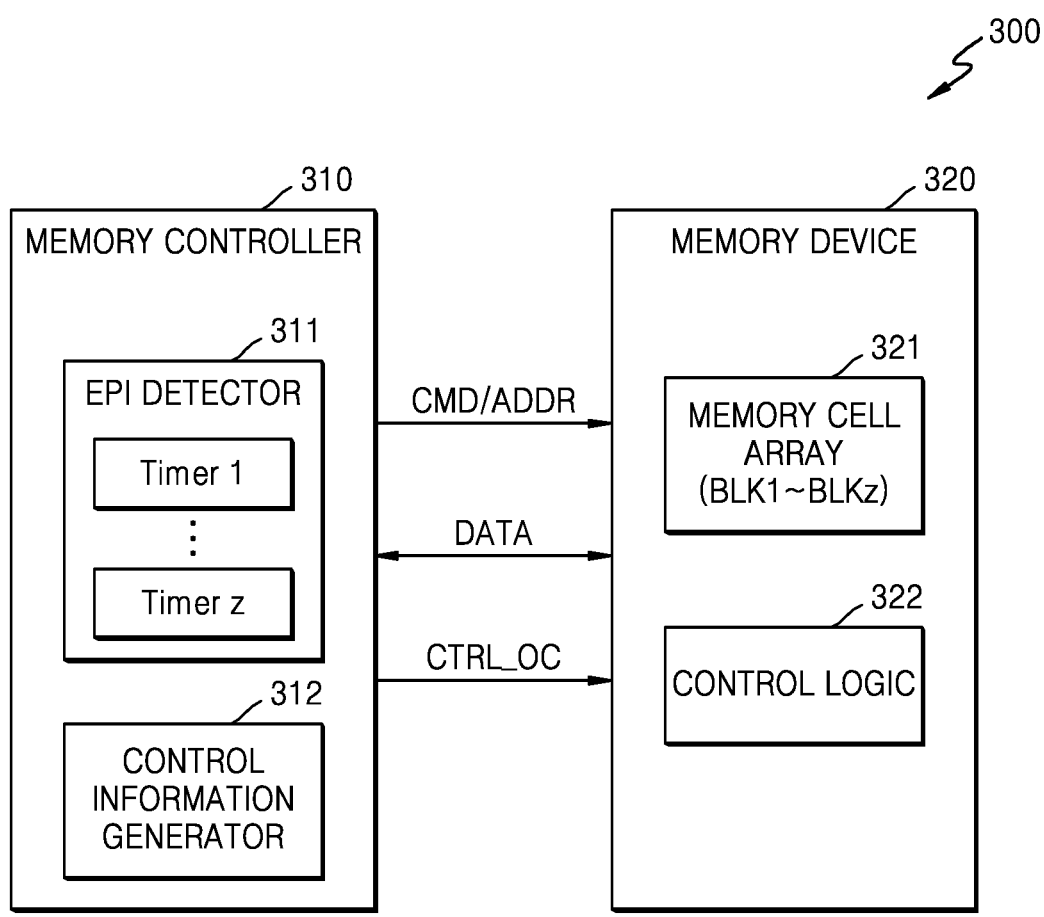
FIGS. 16A and 16B are block diagrams of a memory system according to a modifiable embodiment.
Figure 16B:
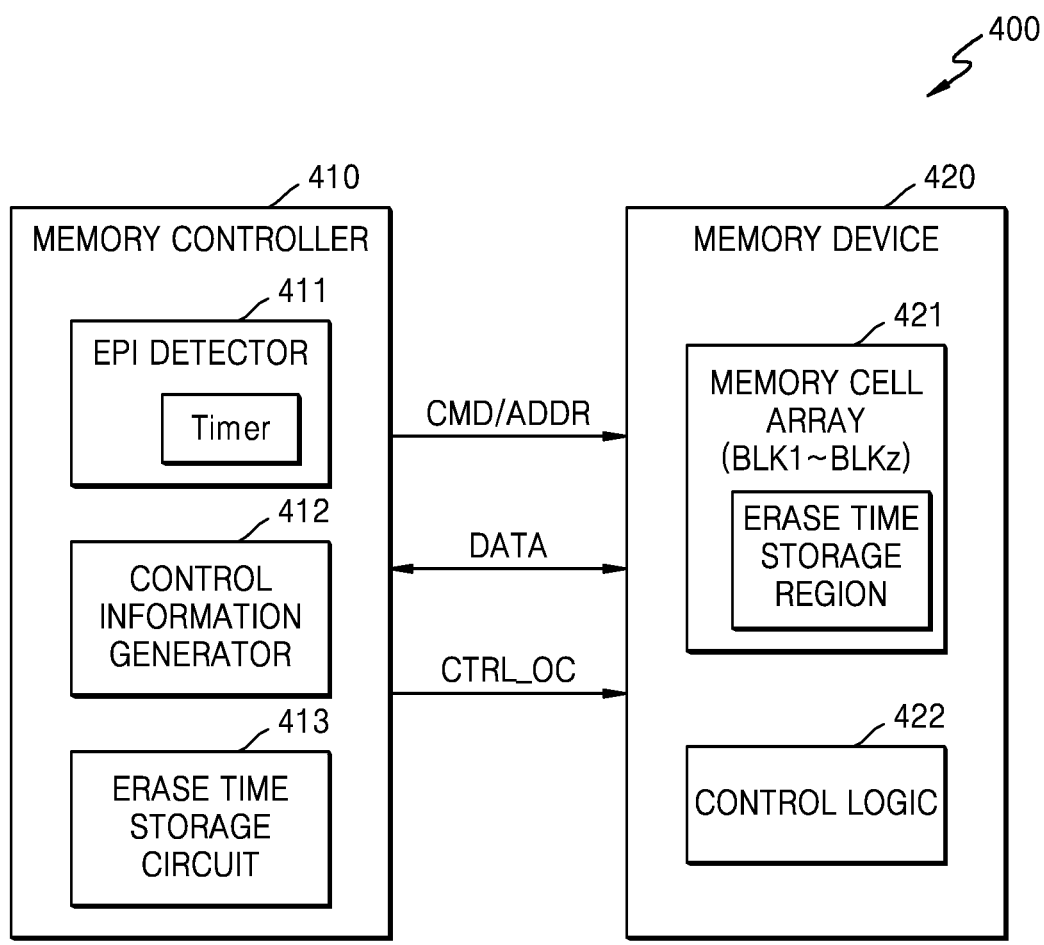

FIGS. 16A and 16B are block diagrams of a memory system according to a modifiable embodiment.

Referring to FIG. 16A, a memory system 300 may include a memory controller 310 and a memory device 320, and the memory controller 310 may include an EPI detector 311 and a control information generator 312. The memory device 320 may include a memory cell array 321 including the plurality of blocks BLK1 to BLKz and control logic 322. The memory controller 310 may provide the command/address CMD/ADDR to the memory device 320, may transmit or receive the data DATA to or from the memory device 320, and according to an embodiment, may provide the control information CTRL_OC for controlling an operation condition to the memory device 320.

The EPI detector 311 may include a plurality of timers Timer 1 to Timer z, and the number of the timers Timer 1 to Timer z may correspond to the number of the blocks BLK1 to BLKz. The memory controller 310 may determine a location of a block subject to a data write request received from the host, and the EPI detector 311 may determine an EPI of the corresponding block by referring to a value of a timer corresponding to the determined block.

Each of the timers Timer 1 to Timer z may determine an EPI based on determination of a time period between an erase time and a write time of a corresponding block. For example, the first timer Timer 1 corresponding to the first block BLK1 may determine an EPI of the first block BLK1 by determining elapse of time from the most recent erase operation of the first block BLK1. The control information generator 312 may generate the control information CTRL_OC indicating one operation condition, based on the determined EPI of the first block BLK1, and provide the control information CTRL_OC to the memory device 320.

Referring to FIG. 16B, a memory system 400 may include a memory controller 410 and a memory device 420, and the memory controller 410 may include an EPI detector 411 and a control information generator 412. The memory device 420 may include a memory cell array 421 including the plurality of blocks BLK1 to BLKz and control logic 422. The EPI detector 411 may include one or more timers, and FIG. 16B illustrates an example of one timer shared by at least two blocks. According to an example embodiment, the memory system 400 may include a storage circuit for storing information related to EPIs of the plurality of blocks BLK1 to BLKz, and for example, the memory controller 410 may include an erase time storage circuit 413, or information related to erase times of the plurality of blocks BLK1 to BLKz may be stored in a partial region (for example, a meta region) of the memory cell array 421.

An example in which a timer in the EPI detector 411 detects EPIs of the first block BLK1 and the second block BLK2 is as follows. The timer may determine a particular point in time, based on time having elapsed since a reference point, and accordingly, may determine an elapsed time after an erase operation is performed on the first block BLK1 and an elapsed time after the erase operation is performed on the second block BLK2. For example, an erase time of the first block BLK1 and an erase time of the second block BLK2 may be different from each other, and the determined erase times may be stored in the erase time storage circuit 413 or a meta region of the memory cell array 421.

Afterwards, the timer may continue to determine time elapse, and as a write request regarding the first block BLK1 is received, may determine a write time of the first block BLK1. The EPI detector 411 may identify information denoting the previously stored erase time of the first block BLK1, may determine an EPI denoting a time period between the write time and the erase time, and according to some embodiments, may perform a write operation on the first block BLK1 according to one of a plurality of operation conditions, based on the determined EPI. Similarly, the timer may determine a write time of the second block BLK2 and may determine an EPI of the second block BLK2 based on information denoting the previously stored erase time of the second block BLK2 and the write time of the second block BLK2.

Figure 17:
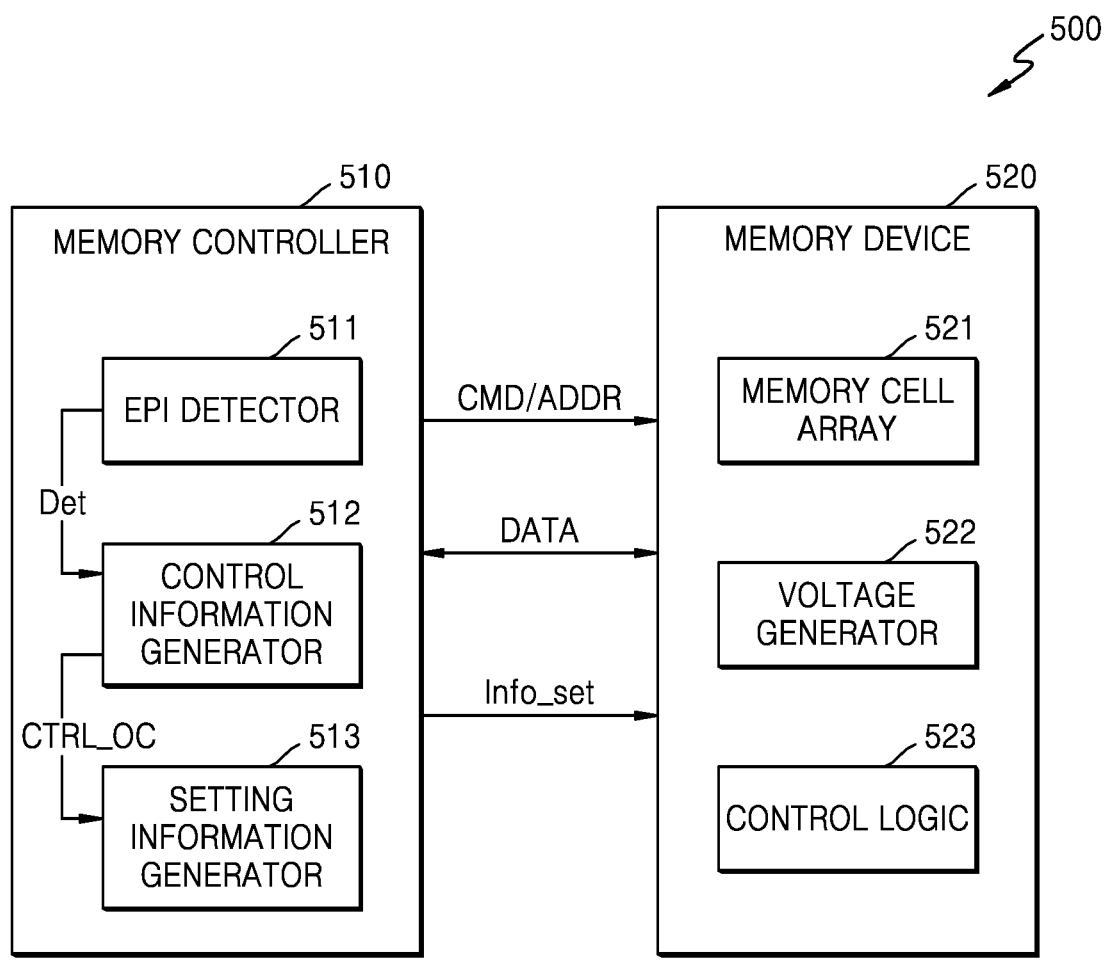
FIG. 17 is a block diagram of a memory system according to another modifiable embodiment.

FIG. 17 is a block diagram of a memory system 500 according to another modifiable embodiment. FIG. 17 illustrates an example of storing setting information related to a plurality of operation conditions in a memory controller.

Referring to FIG. 17, the memory system 500 may include a memory controller 510 and a memory device 520, and the memory controller 510 may include an EPI detector 511, a control information generator 512, and a setting information generator 513. The memory device 520 may include a memory cell array 521 including the plurality of blocks BLK1 to BLKz, a voltage generator 522, and control logic 523. The memory controller 510 may provide the command/address CMD/ADDR to the memory device 520 and may transmit or receive the data DATA to or from the memory device 520.

According to some embodiments, the memory controller 510 may determine a block subject to a data write request received from a host and may determine an EPI of the determined block. The EPI detector 511 may provide a detection result Det obtained by determining an EPI of the block subject to the write request to the control information generator 512, the control information generator 512 may compare the EPI of the block subject to the write request with one or more reference times, and based on a comparison result thereof, may provide the control information CTRL_OC to the setting information generator 513.

The setting information generator 513 may store setting information Info_set for setting levels of various voltages for use in a memory operation within the memory device 520. According to an embodiment, the memory device 520 may perform a write operation according to one of a plurality of operation conditions, based on a detection result of the EPI of the block, and the setting information generator 513 may output the setting information Info_set of an operation condition corresponding to the control information CTRL_OC from among setting information of the plurality of operation conditions.

Figure 18:
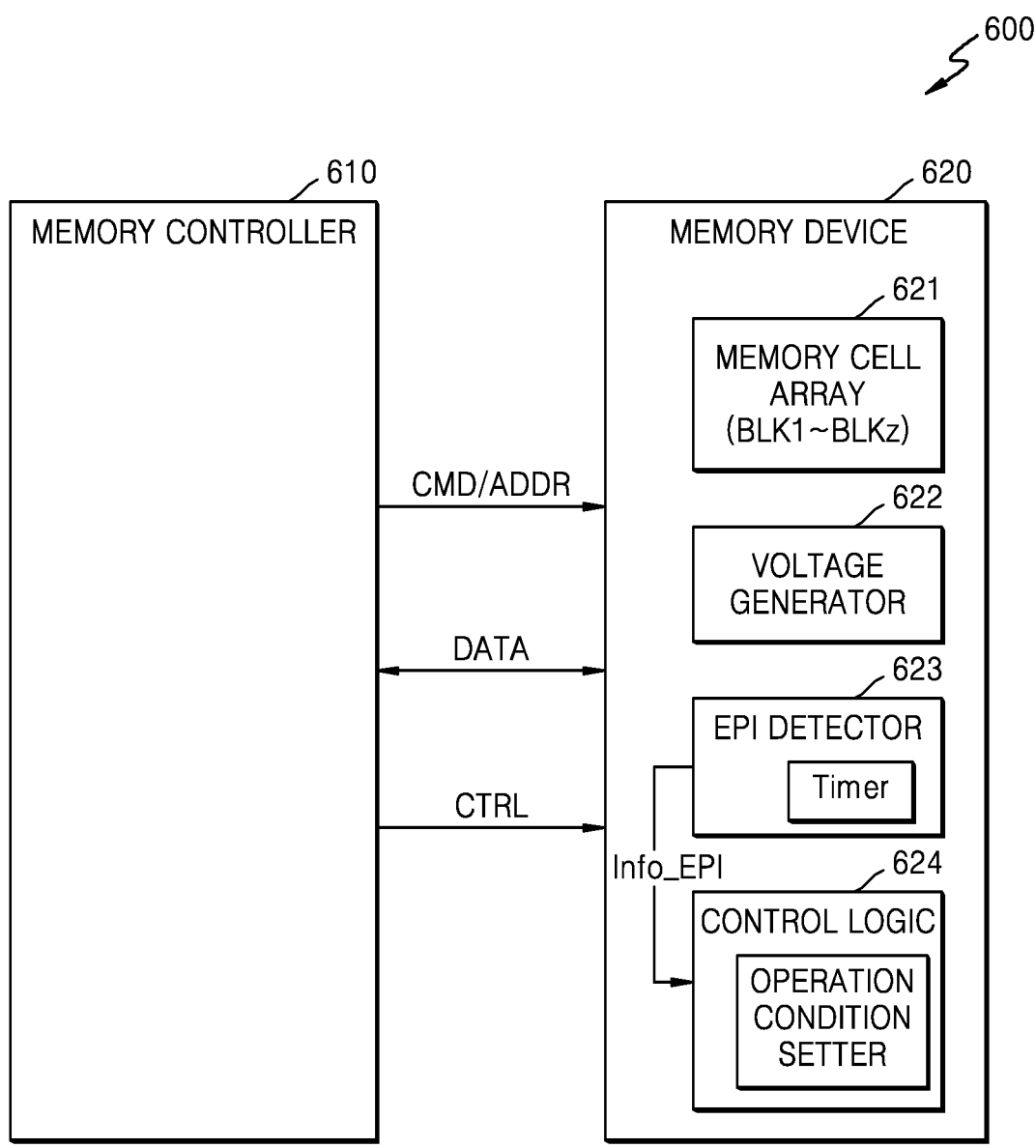
FIG. 18 is a block diagram of a memory system according to another modifiable embodiment.

FIG. 18 is a block diagram of a memory system 600 according to another modifiable embodiment. FIG. 18 illustrates an example of determining EPIs of blocks within a memory device.

Referring to FIG. 18, the memory system 600 may include a memory controller 610 and a memory device 620, and the memory device 620 may include a memory cell array 621 including the plurality of blocks BLK1 to BLKz, a voltage generator 622, an EPI detector 623, and control logic 624. The memory controller 610 may provide the command/address CMD/ADDR to the memory device 620, may transmit or receive the data DATA to or from the memory device 620, and may provide the control signal CTRL for controlling a memory operation to the memory device 620.

The memory device 620 may determine a block to which data is to be written, based on the address ADDR provided along with a write command from the memory controller 610. For example, the address ADDR may include a block address indicating one of a plurality of blocks of the memory cell array 621, and the EPI detector 623 may determine an EPI of the block selected based on the block address. As in the previous embodiment, the EPI detector 623 may include one or more timers, and for example, may include timers as many as the blocks of the memory cell array 621 or may include timers fewer than the blocks.

For example, in regard to a first block, an erase operation may be performed on the first block according to a command received from the memory controller 610, or an erase operation may be performed on the first block through an internal operation such as a garbage collection operation within the memory device 620. The EPI detector 623 may determine an erase time of the first block, may determine an EPI of the first block by determining time having elapsed since the most recent erase operation of the first block, and may provide EPI information Info_EPI denoting the determined EPI to the control logic 624.

The control logic 624 may include an operation condition setter, and the operation condition setter may include setting information related to a plurality of operation conditions. The control logic 624 may set an operation condition of the memory device 620, based on the EPI information Info_EPI regarding the first block, which is received from the EPI detector 623. For example, the control logic 624 may control the voltage generator 622 according to setting information corresponding to one operation condition selected from among the plurality of operation conditions, and the voltage generator 622 may output a program voltage having a changed level, a verify voltage, and a read voltage.

Figure 19:
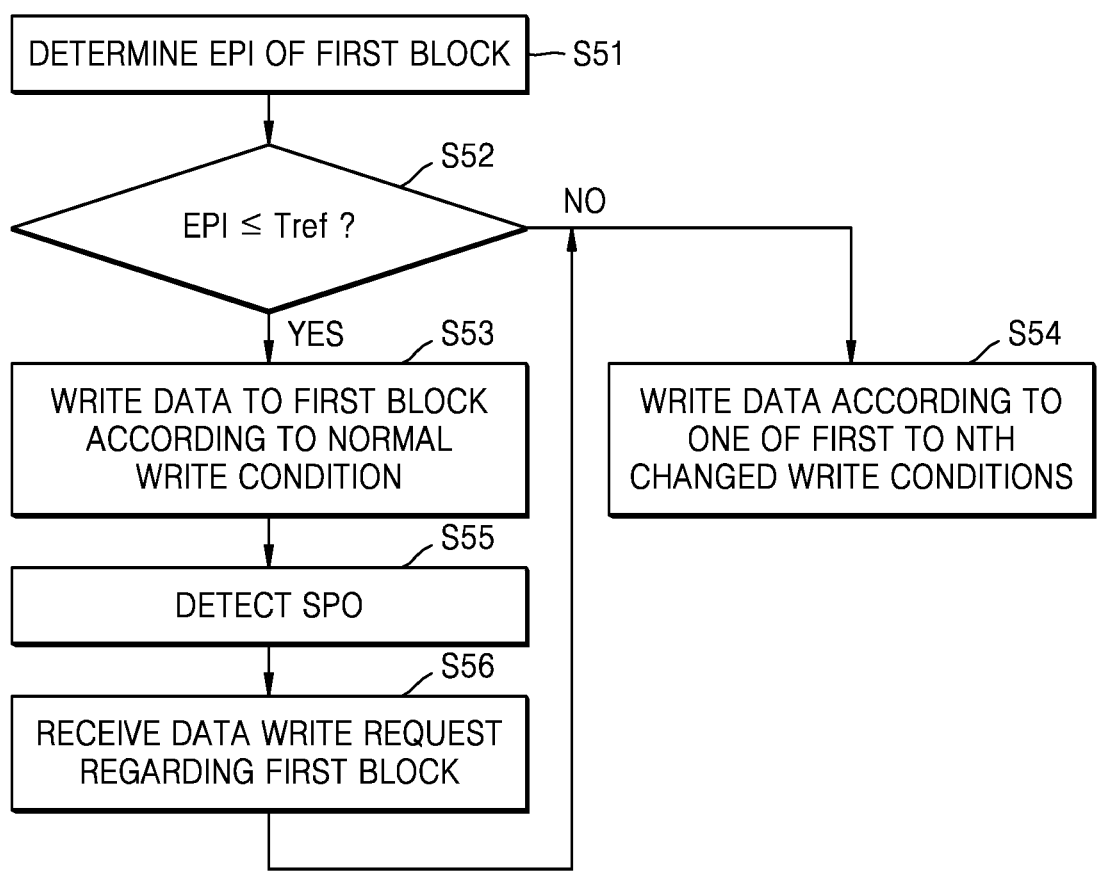
FIGS. 19 and 20 are flowcharts of an operating method of a memory system, according to a modifiable embodiment.
Figure 20:
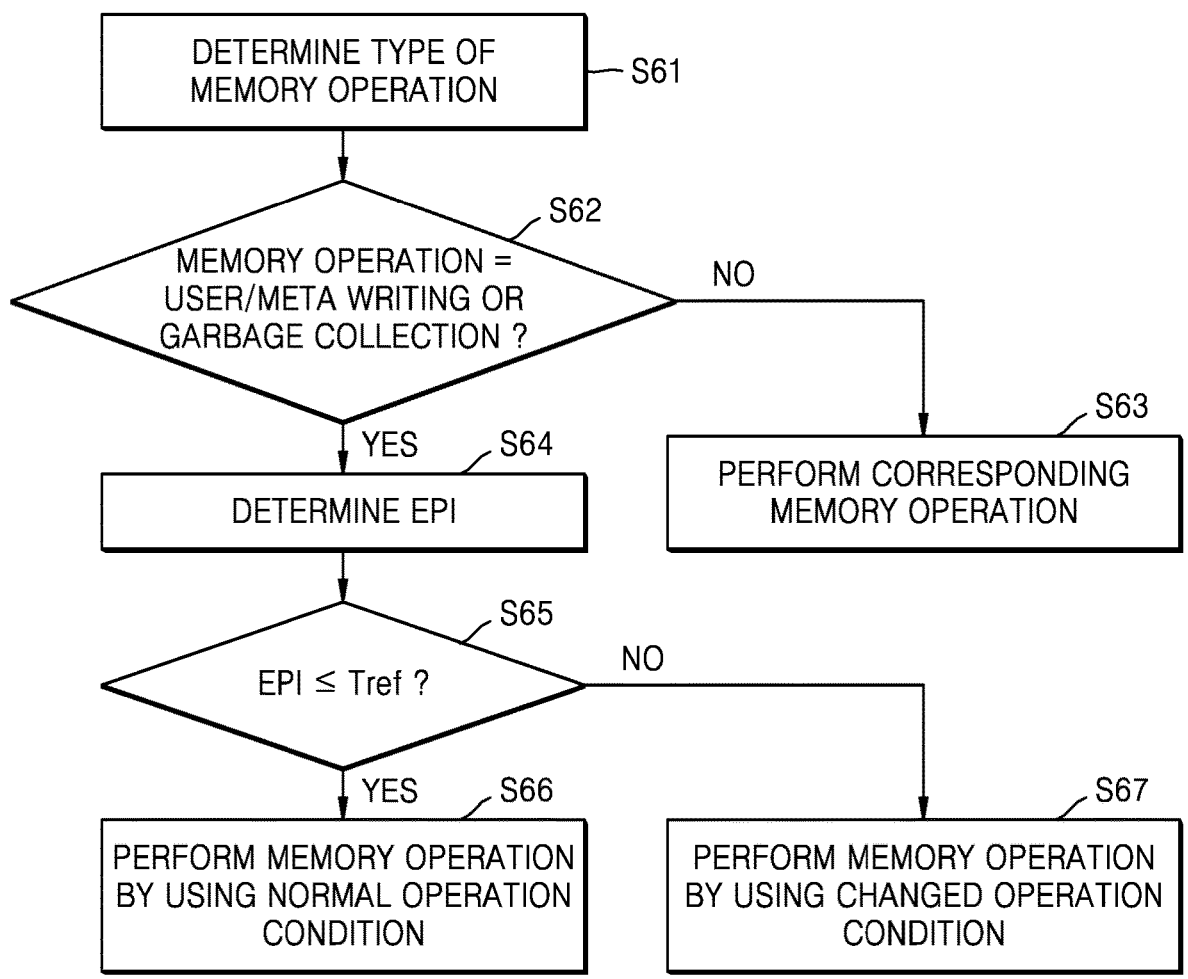

FIGS. 19 and 20 are flowcharts of an operating method of a memory system, according to a modifiable embodiment.

Referring to FIG. 19, a memory system may determine an EPI when performing a write operation on a block according to some embodiments, and as a write request regarding a first block is received, may determine an EPI of the first block (in operation S51). The determined EPI of the first block may be compared with the reference time Tref (in operation S52), and as the EPI of the first block is equal to or less than the reference time Tref, data may be written to the first block according to a normal write condition (in operation S53). On the other hand, when the EPI of the first block is greater than the reference time Tref, data may be written to the first block by using a changed write condition where a level of at least one of a program voltage and a verify voltage is changed, according to some embodiments, and for example, data may be written to the first block according to one of first to $N^{th}$ changed conditions as a plurality of changed write conditions (in operation S54). That is, as time elapses after the first block is erased, the EPI of the first block may be determined with one of a plurality of stages, and one of a plurality of changed write conditions may be selected according to a result of determining the EPI.

During an operation of the memory system, sudden power-off (SPO) may occur. Due to the occurrence of SPO, a timer for determining EPIs for blocks may be reset or information denoting erase times of blocks may be erased, and thus, the accuracy of the EPI detection result may decrease. According to an embodiment, the memory system may detect SPO (in operation S55) and may receive a data write request regarding the first block after determining the SPO (in operation S56). In this regard, when a write request is received after the SPO occurs, it may be assumed that a lot of time has elapsed after an erase operation is performed on the actual first block, and data may be written to the first block according to one of first to $N^{th}$ changed write conditions for the first block (in operation S54). In a case where a plurality of changed write conditions are defined, when SPO does not occur, one changed write condition may be selected according to an EPI determined with respect to a write-requested block, and after SPO occurs, with respect to a write-requested block, one of the plurality of changed write conditions may be selected or a particular changed write condition may be selected.

FIG. 20 illustrates an example of a memory operation to which operation conditions are applied according to example embodiments.

Referring to FIG. 20, a memory system may perform various memory operations through a request received from a host and internal operations, and a type of a performed memory operation may be determined (in operation S61). The memory operation may be performed on one block or may be simultaneously or sequentially performed on a plurality of blocks.

According to an embodiment, whether the memory operation corresponds to writing of user data, writing of meta data, or garbage collection may be determined (in operation S62). For example, when the memory operation does not correspond to the operation described above, the corresponding memory operation may be performed without having to separately perform EPI detection and setting of an operation condition. On the other hand, when the memory operation corresponds to a write operation of user data or metadata, according to some embodiments, a block to which user data or metadata is to be written may be determined and an EPI of the determined block may be determined (in operation S64), and whether the determined EPI is equal to or less than the reference time Tref or not may be determined (in operation S65). When the determined EPI is equal to or less than the reference time Tref, the memory operation may be performed on the block by using a normal operation condition (in operation S66). On the other hand, when the determined EPI is greater than the reference time Tref, the memory operation may be performed on the block by using a changed operation condition (in operation S67).

When the memory operation corresponds to a garbage collection operation, valid data stored in one or more blocks may be moved to another block, and a free block may be generated by erasing the one or more blocks after movement of the valid data. For example, when an erase operation is performed on a first block, valid data in the first block may be moved to a second block, and in this regard, an EPI of the second block may be determined. That is, based on a result of comparing the EPI determined with respect to the second block with the reference time Tref, the valid data may be written to the second block by using a normal operation condition or may be written to the second block by using a changed operation condition.

Figure 21:
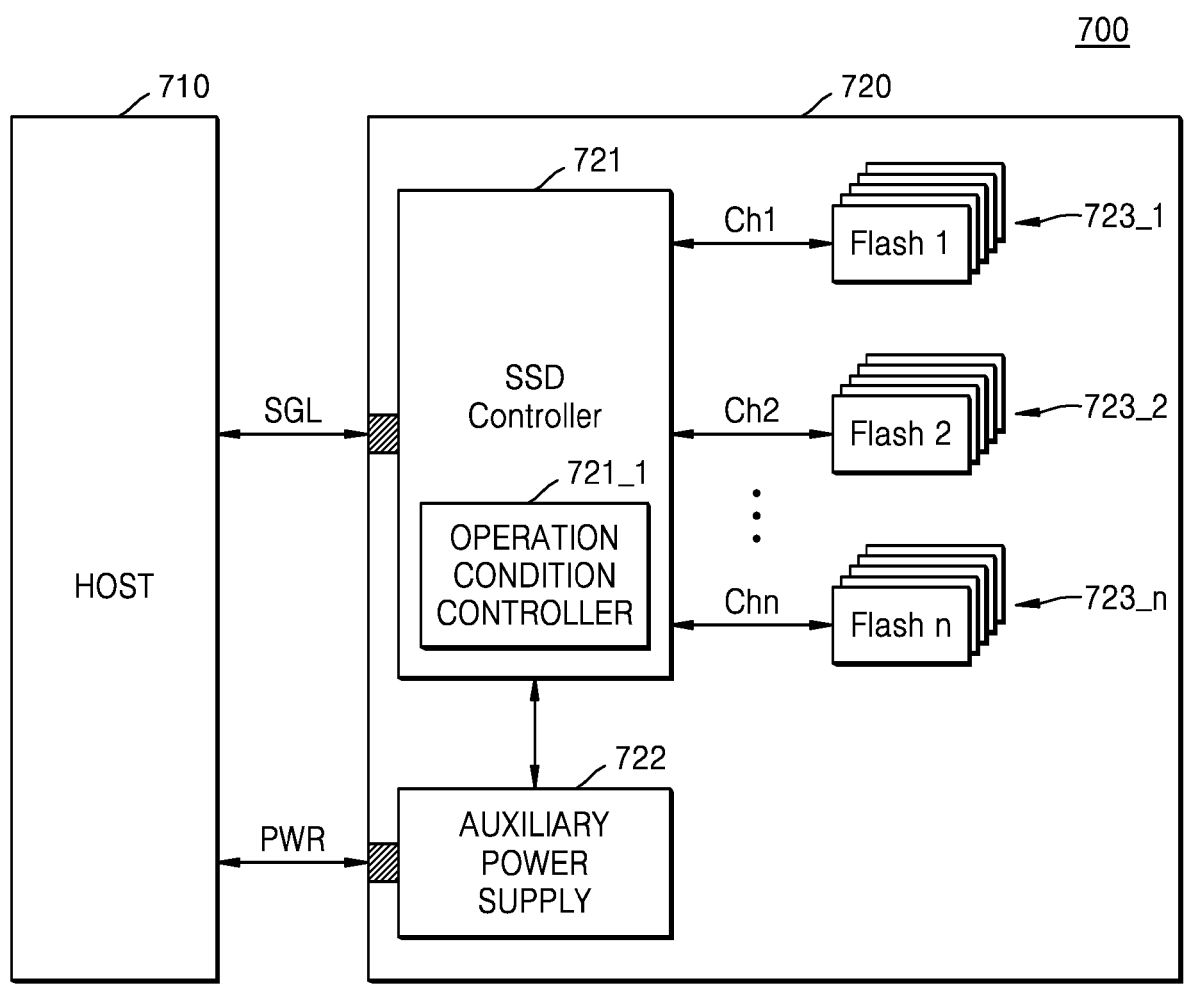
FIG. 21 is a block diagram of an example of a memory device in a solid state drive (SSD) system, according to embodiments.

FIG. 21 is a block diagram of an example of a memory device in an SSD system, according to embodiments.

Referring to FIG. 21, an SSD system 700 may include a host 710 and an SSD 720. The SSD 720 may exchange signals with the host 710 via a signal connector and may receive power via a power connector. The SSD 720 may include an SSD controller 721, an auxiliary power supply, and memory devices 723_1 to 723_n. In this regard, the SSD 720 may be implemented using the embodiments described above with reference to FIGS. 1 to 20. According to an embodiment, the SSD controller 721 may include an operation condition controller 721_1, and each of the memory devices 723_1 to 723_n may include a plurality of blocks.

The embodiments described herein may be embodied by the SSD system 700 illustrated in FIG. 21, and during write and/or read operations on the memory devices 723_1 to 723_n, the SSD controller 721 may determine an EPI for each block, and based on a detection result, may control operation conditions of the memory devices 723_1 to 723_n. The operation condition controller 721_1 may include an element for determining an EPI and an element generating control information for indicating an operation condition. Also, each of the memory devices 723_1 to 723_n may store setting information for performing a memory operation according to one operation condition, based on the control information. According to some embodiments, when data is programmed after a long EPI state, threshold voltage distribution may be reduced after the program operation, and degradation of a threshold voltage distribution characteristic may be balanced by changing at least one of a program voltage, a verify voltage, and a read voltage.

While the inventive concept has been particularly shown and described with reference to embodiments thereof, it will be understood that various changes in form and details may be made therein without departing from the spirit and scope of the following claims.

What is claimed is:

1. An operating method of a memory system comprising a memory device comprising a memory cell array, the memory cell array comprising a first block including a plurality of pages, the operating method comprising:
   upon receipt of a read request of data with respect to a first page of the first block, performing a first reading of information regarding an erase program interval (EPI) denoting a time period between an erase time and a program time of the first page stored in the memory cell array;
   reading data of the first page by using a first read voltage having a first level according to a result of the first reading;
   upon receipt of a read request of data with respect to a second page of the first block, performing a second reading of information regarding the EPI denoting a time period between an erase time and a program time of the second page stored in the memory cell array; and
   reading data of the second page by using a second read voltage having a second level different from the first level according to a result of the second reading.

2. An operating method of a memory system comprising a memory device comprising a memory cell array, the memory cell array comprising a first block including a plurality of pages, the operating method comprising:
   upon receipt of a read request of data with respect to a first page of the first block, performing a first reading of information regarding an erase program interval (EPI) denoting a time period between an erase time and a program time of the first page or information regarding an operation condition applied to the first page stored in the memory cell array;
   reading data of the first page by using a first read voltage having a first level according to a result of the first reading;
   upon receipt of a read request of data with respect to a second page of the first block, performing a second reading of information regarding the EPI denoting a time period between an erase time and a program time of the second page or information regarding the operation condition applied to the second page stored in the memory cell array; and
   reading data of the second page by using a second read voltage having a second level different from the first level according to a result of the second reading,
   wherein
     in a case where the EPI of the first page is less than a reference time, the data of the first page is data programmed by using a first operation condition among a plurality of operation conditions, and
     in a case where the EPI of the second page is greater than the reference time, the data of the second page is data programmed by using a second operation condition among the plurality of operation conditions.

3. The operating method of claim 2, wherein a level of at least one of a program voltage and a verify voltage under the first operation condition is different from a corresponding level under the second operation condition.

4. The operating method of claim 2,
   wherein information regarding the first operation condition applied to the first page and information regarding the second operation condition applied to the second page are stored in the memory cell array, and
   wherein the second level is lower than the first level, according to the first operation condition and the second operation condition read from the memory cell array.

5. The operating method of claim 1, wherein
   the EPI of the first page is stored in the memory cell array when data is written in the first page, the EPI of the second page is stored in the memory cell array when data is written in the second page, and
   the first level and the second level are set based on the EPI of the first page and the EPI of the second page read from the memory cell array.

6. The operating method of claim 5, wherein the second level is lower than the first level, in a case where the EPI of the first page is less than a reference time and the EPI of the second page is greater than the reference time.

7. The operating method of claim 1 further comprising:
   reading data of a third page of the first block in response to a read request;
   determining whether data read from the third page has an uncorrectable error; and
   selectively performing a read operation using the information regarding the EPI read from the memory cell array when it is determined that the data read from the third page has the uncorrectable error.

8. The operating method of claim 1, wherein the information regarding the EPI of the first and second pages is stored in a meta region of the memory cell array.

9. The operating method of claim 1, wherein
   in response to the EPI of the first page being less than a reference time, the first level is set,
   in response to the EPI of the second page being greater than the reference time, the second level is set, and
   wherein the second level is lower than the first level.

10. The operating method of claim 1, further comprising tracking an EPI of each of a plurality of blocks of the memory device, including the first block, with a plurality of timers wherein each timer provides a corresponding EPI for a corresponding one of the plurality of blocks.

11. The operating method of claim 10, further comprising outputting a voltage control signal to a voltage generator of the memory device to select at least one of a level of the program voltage and a level of the verify voltage that is generated by the voltage generator during a programming operation of a page in one of the plurality of blocks based on the EPI of that block as provided by its corresponding timer.

12. The operating method of claim 1, further comprising performing a garbage collection operation for moving valid data of the first block to a second block,
   wherein, during the garbage collection operation, a level of at least one of a program voltage and a verify voltage, which are used to write the valid data of the first block to the second block, is adjusted based on an EPI of the second block.

13. The operating method of claim 1, further comprising, before the steps of claim 1:
   erasing the first block; and
   programming, using a first operation condition, the data of the first page to the first page of the first block when the first block is in the erase state without any programmed data,
   wherein at least one of a program voltage and a verify voltage under the first operation condition is selected based on the EPI of the first block.

14. The operating method claim 2,
   wherein threshold voltage distribution levels of the second page are relatively greater compared to threshold voltage distribution levels of the first page.

* * * * *